(12) United States Patent
Chae

(10) Patent No.: US 10,403,704 B2
(45) Date of Patent: Sep. 3, 2019

(54) DISPLAY APPARATUS

(71) Applicant: Samsung Display Co., Ltd., Yongin-si, Gyeonggi-do (KR)

(72) Inventor: Se Byung Chae, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 119 days.

(21) Appl. No.: 15/416,352

(22) Filed: Jan. 26, 2017

(65) Prior Publication Data

US 2017/0221979 A1     Aug. 3, 2017

(30) Foreign Application Priority Data

Jan. 28, 2016   (KR) ........................ 10-2016-0010849

(51) Int. Cl.
*H01L 27/32* (2006.01)
*G09G 3/20* (2006.01)
*G09G 3/30* (2006.01)

(52) U.S. Cl.
CPC ...... *H01L 27/3276* (2013.01); *H01L 27/3262* (2013.01); *H01L 27/3272* (2013.01); *H01L 27/3279* (2013.01); *G09G 2330/06* (2013.01)

(58) Field of Classification Search
CPC ............. H01L 27/3276; H01L 27/3262; H01L 27/3272; H01L 27/326; H01L 27/3248; H01L 27/3244; H01L 27/3241; H01L 27/3223; H01L 27/32; H01L 27/28; H01L 27/00; H01L 27/3279; G09G 3/3648; G09G 3/3696; G09G 3/3659; G09G 2300/0413; G09G 2330/00; G09G 2330/06; G09G 2330/04; G06F 1/182; G06F 1/26
See application file for complete search history.

(56) References Cited

U.S. PATENT DOCUMENTS

| | | | |
|---|---|---|---|
| 8,378,930 B2 * | 2/2013 | Asano | G09G 3/3233 345/76 |
| 9,035,862 B2 | 5/2015 | Sato | |
| 2012/0229438 A1 * | 9/2012 | Fujita | G09G 3/3233 345/211 |

(Continued)

FOREIGN PATENT DOCUMENTS

| | | |
|---|---|---|
| JP | 5445239 B2 | 3/2014 |
| KR | 10-2014-0093091 A | 7/2014 |
| KR | 10-2015-0025537 A | 3/2015 |

*Primary Examiner* — Julie Anne Watko
(74) *Attorney, Agent, or Firm* — Lewis Roca Rothgerber Christie LLP

(57) ABSTRACT

A display apparatus includes: a scan line extending in a first direction; a first data line and a second data line extending in a second direction crossing the first direction; a fixed voltage line extending in the second direction between the first and second data lines and configured to receive a fixed voltage; an auxiliary line between the fixed voltage line and one of the first and second data lines, wherein the fixed voltage is applied to the auxiliary line; a transistor circuit comprising a second transistor coupled to the scan line and the first data line and a first transistor coupled to the second transistor and the fixed voltage line; and a light emitting device coupled to the transistor circuit, wherein at least a portion of the transistor circuit is between the fixed voltage line and the auxiliary line.

36 Claims, 19 Drawing Sheets

(56) References Cited

U.S. PATENT DOCUMENTS

| | | | |
|---|---|---|---|
| 2012/0319184 A1* | 12/2012 | Tanzawa | H01L 23/5225 257/288 |
| 2013/0113060 A1* | 5/2013 | Matsunaga | H01L 27/14632 257/431 |
| 2014/0034923 A1* | 2/2014 | Kim | H01L 27/3297 257/40 |
| 2014/0198135 A1 | 7/2014 | Eom et al. | |
| 2015/0009105 A1* | 1/2015 | Nomura | G09G 3/006 345/76 |
| 2015/0061983 A1 | 3/2015 | Kim | |
| 2016/0247452 A1* | 8/2016 | Lee | H01L 27/3276 |
| 2017/0365647 A1* | 12/2017 | Choi | G09G 3/3233 |

\* cited by examiner

DISPLAY APPARATUS

CROSS-REFERENCE TO RELATED APPLICATION

This application claims priority to and the benefit of Korean Patent Application No. 10-2016-0010849, filed on Jan. 28, 2016, in the Korean Intellectual Property Office, the entire content of which is incorporated herein by reference in its entirety.

BACKGROUND

1. Field

Aspects of example embodiments of the present invention relate to a display apparatus.

2. Description of the Related Art

An organic light emitting device may include two electrodes and an organic light emitting layer located therebetween. Electrons injected from one of the two electrodes and holes injected from the other electrode may be combined to form excitons, which may emit energy, thereby emitting light.

The organic light emitting device may include a plurality of pixels including self-light emitting devices. Lines and a plurality of thin film transistors for driving an organic light emitting diode may be formed on each of the pixels.

Parasitic capacitance may occur between the wiring lines and the thin film transistors, which may reduce display quality.

The above information disclosed in this Background section is provided for enhancement of understanding of the background of the invention, and therefore, it may contain information that does not constitute prior art.

SUMMARY

Aspects of example embodiments of the present invention relate to a display apparatus, and a display apparatus including a light emitting device.

Aspects of example embodiments of the present invention include a display apparatus that may have relatively improved display quality by preventing or reducing instances of parasitic capacitance.

According to some example embodiments of the present invention, a display apparatus includes: a scan line extending in a first direction; a first data line and a second data line extending in a second direction crossing the first direction; a fixed voltage line extending in the second direction between the first and second data lines and configured to receive a fixed voltage; an auxiliary line between the fixed voltage line and one of the first and second data lines, wherein the fixed voltage is applied to the auxiliary line; a transistor circuit comprising a second transistor coupled to the scan line and the first data line and a first transistor coupled to the second transistor and the fixed voltage line; and a light emitting device coupled to the transistor circuit, wherein at least a portion of the transistor circuit is between the fixed voltage line and the auxiliary line.

According to some embodiments, the auxiliary line is configured to receive the fixed voltage having a same level as the fixed voltage line.

According to some embodiments, the auxiliary line is coupled to the fixed voltage line.

According to some embodiments, the auxiliary line has an open loop shape surrounding at least the portion of the transistor circuit, together with the fixed voltage line, and having an open end as viewed in a plane.

According to some embodiments, the auxiliary line has a closed loop shape surrounding at least the portion of the transistor circuit, together with the fixed voltage line, as viewed in a plane.

According to some embodiments, the auxiliary line is on a same layer as the fixed voltage line and the first and second data lines.

According to some embodiments, the fixed voltage line is a power supply line extending in the second direction.

According to some embodiments, the auxiliary line is on a same layer as the power supply line and the first and second data lines.

According to some embodiments, the auxiliary line comprises a body portion extending in the second direction.

According to some embodiments, the body portion is between one of the first and second data lines and a gate electrode of the first transistor.

According to some embodiments, the body portion crosses an imaginary line connecting between the gate electrode of the first transistor and one of the first and second data lines by a shortest distance as viewed in a plane.

According to some embodiments, a distance between one of the first and second data lines and the auxiliary line is shorter than a distance between one of the first and second data lines and the gate electrode of the first transistor.

According to some embodiments, the gate electrode has a first length in the second direction and the body portion has a length greater than or equal to the first length in the second direction.

According to some embodiments, the auxiliary line extends from the power supply line.

According to some embodiments, the auxiliary line comprises a first connection portion coupled to one end of the body portion and the power supply line.

According to some embodiments, the auxiliary line comprises a second connection portion coupled to the other end of the body portion and the power supply line.

According to some embodiments, the auxiliary line has a closed loop shape surrounding a gate electrode of the first transistor, together with the power supply line, as viewed in a plane.

According to some embodiments, the auxiliary line has an open loop shape surrounding the gate electrode of the first transistor, together with the power supply line, and having an open one end as viewed in a plane.

According to some embodiments, at least the portion of the first transistor is formed on a same layer as the first and second data lines.

According to some embodiments, the first transistor includes: an active pattern on a base substrate; the gate electrode on the active pattern with a gate insulating layer interposed therebetween; a source electrode and a drain electrode coupled to the active pattern; and a connection line coupled to the gate electrode.

According to some embodiments, the connection line is formed on a same layer as the first and second data lines.

According to some embodiments, an interlayer insulating layer is on the gate insulating layer, and the connection line is on the interlayer insulating layer and connected to the gate electrode through a contact hole passing through the interlayer insulating layer.

According to some embodiments, the connection line extends in the second direction.

According to some embodiments, the body portion is between one of the first and second data lines and the connection line as viewed in a plane.

According to some embodiments, the body portion crosses an imaginary line connecting between the connection line and one of the first and second data lines by a shortest distance as viewed in the plane.

According to some embodiments, the connection line has a second length in the second direction and the body portion has a length greater than or equal to the second length in the second direction.

According to some embodiments, the auxiliary line extends from the power supply line.

According to some embodiments, the auxiliary line further comprises a first connection portion connecting one end of the body portion and the power supply line to each other.

According to some embodiments, the auxiliary line further comprises a second connection portion connecting the other end of the body portion and the power supply line.

According to some embodiments, the auxiliary line has a closed loop shape surrounding the connection line, together with the power supply line, as viewed in the plane.

According to some embodiments, the auxiliary line has an open loop shape surrounding the connection line, together with the power supply line, and having an open end as viewed in the plane.

According to some embodiments, the display apparatus further includes an initialization power supply line extending in the first direction, wherein an initial fixed voltage is applied to the initialization power supply line.

According to some embodiments, the auxiliary line is coupled to the initialization power supply line.

According to some embodiments, the initialization power supply line is on the gate insulating layer, and the auxiliary line is coupled to the initialization power supply line through a contact hole passing through the interlayer insulating layer.

According to some example embodiments of the present invention, a display apparatus includes: a scan line extending in a first direction; a first data line and a second data line extending in a second direction crossing the first direction; a power supply line extending in the second direction; a second transistor coupled to the scan line and the first data line; a first transistor between the first and second data lines and coupled to the second transistor and the power supply line; and an auxiliary line between at least a portion of the first transistor and one of the first and second data lines, wherein the power supply line is between at least the portion of the first transistor and the other data line, and a fixed voltage is applied to the auxiliary line.

According to some example embodiments of the present invention, a display apparatus includes: a wiring part and pixels coupled to the wiring part and arranged in a matrix format, wherein the wiring part includes: scan lines extending in a first direction; a first data line and a second data line extending in a second direction crossing the first direction; and power supply lines extending in the second direction, wherein each of the pixels includes: a first transistor coupled to a corresponding scan line of the scan lines and one of the first and second data lines; a second transistor between the first and second data lines and coupled to the first transistor and a corresponding power supply line of the power supply lines; an auxiliary line between at least a portion of the first transistor and one of the first and second data lines; and a display device coupled to the first transistor, and wherein the power supply line is between at least the portion of the first transistor and the other data line, and a fixed voltage is applied to the auxiliary line.

According to some example embodiments, the pixels comprise first pixels and second pixels arranged alternately in a column direction, the second transistor of each of the first pixels is coupled to the first data line, and the second transistor of each of the second pixels is coupled to the second data line.

BRIEF DESCRIPTION OF THE DRAWINGS

Aspects of some example embodiments are described hereinafter with reference to the accompanying drawings. The present system and method, however, should not be construed as being limited to these embodiments. Rather, these embodiments are provided to facilitate the understanding by those of ordinary skill in the art.

In the drawings, the dimensions of the figures may be exaggerated for clarity. It is understood that when an element is referred to as being "between" two elements, it may be the only element between the two elements, or one or more intervening elements may also be present, unless otherwise indicated. Like reference numerals refer to like elements throughout.

DETAILED DESCRIPTION

Figure 1:
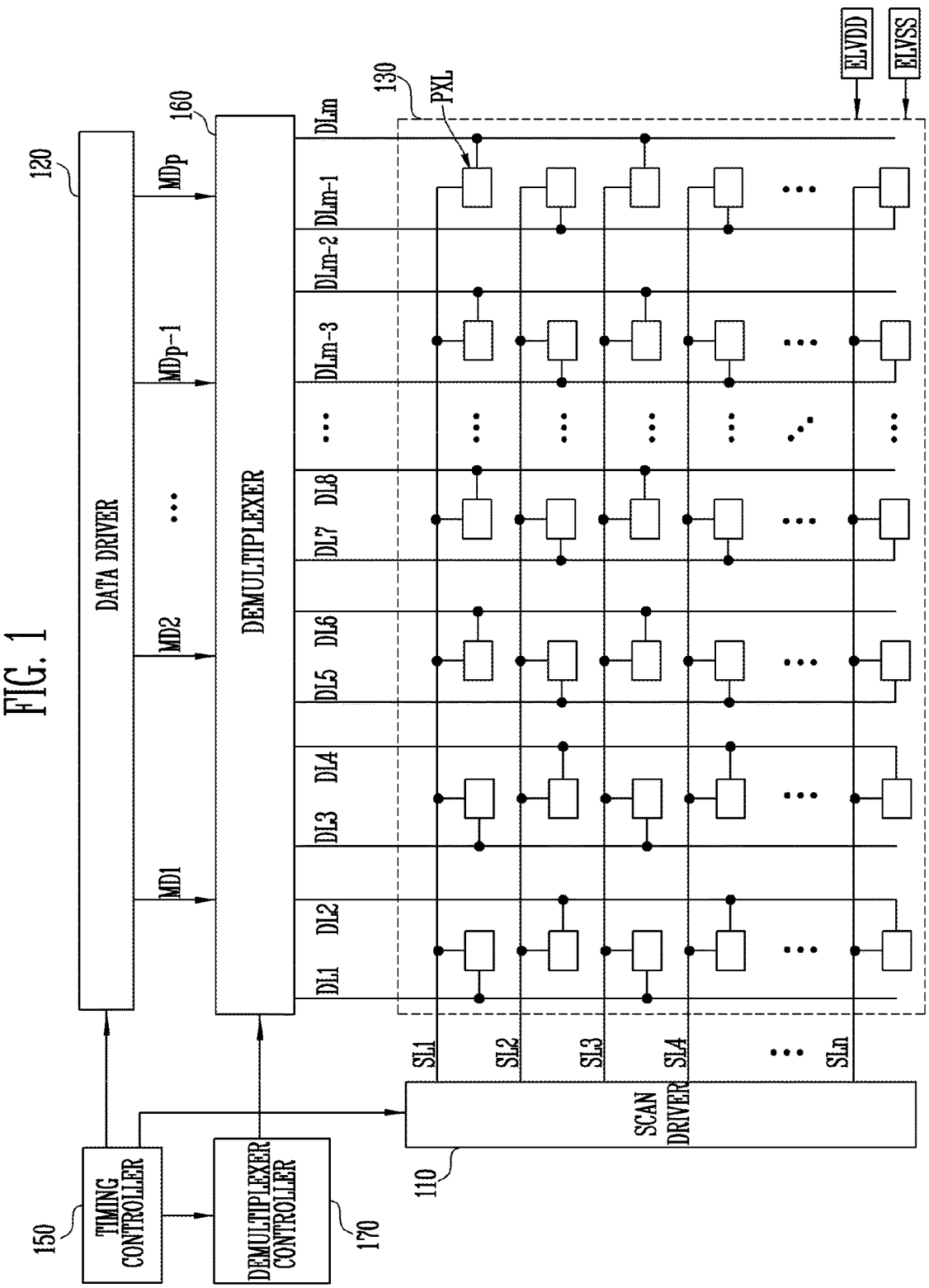
FIG. 1 is a diagram illustrating a display apparatus according to some example embodiments of the present invention.

While aspects of some example embodiments of the present invention are described with reference to the accompanying drawings, it is to be understood that various changes and modifications may be made in the invention without departing from the spirit and scope thereof. Further, it should be understood that the invention is not limited to the specific embodiments thereof, and various changes, equivalences and substitutions may be made without departing from the scope and spirit of the invention.

Like reference numerals designate like elements throughout the drawings. In the drawings, the dimension of elements may be exaggerated for the clarity of this invention. Although terms "first", "second", etc. are used herein to describe various elements, these elements should not be limited by these terms. These terms are only used to distinguish one element from another element. For example, the first element may be designated as the second element without departing from the scope of the invention. Similarly, the second element may be designated as the first element. Further, the singular forms "a" and "an" include plural referents unless the context clearly dictates otherwise.

Herein, it should be understood that terms "include" or "have" are inclusive of characteristics, numerals, steps, operations, elements, parts or combination thereof, but are not exclusive of one or more different characteristics, numerals, steps, operations, elements, parts or combination thereof. Further, when an element, such as a layer, a film, a region or a plate, is referred to as being "on" another element, it can be directly on the another element or be on the another element with one or more intervening elements interposed therebetween. Also, when an element, such as a layer, a film, a region or a plate, is referred to as being "under" another element, it can be right under the another element or be under the another element with one or more intervening elements interposed therebetween. In this disclosure, the term "substantially" includes the meanings of completely, almost completely or to any significant degree under some applications and in accordance with those skilled in the art. Moreover, "formed on" can also mean "formed over."

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Hereinafter, aspects of some example embodiments will be described in more detail with reference to the accompanying drawings.

FIG. 1 is a diagram illustrating a display apparatus according to some example embodiments of the present invention.

Referring to FIG. 1, a display apparatus according to some embodiments may include a scan driver 110, a data driver 120, a pixel unit 130, a timing controller 150, a demultiplexer 160 and a demultiplexer controller 170.

The pixel unit 130 may include the pixels PXL. In the present embodiment, the pixels PXL may be located in regions divided by scan lines SL1 to SLn and data lines DL1 to DLm. FIG. 1 illustrates the pixel unit 130 including m×n pixels PXL. The pixels PXL may receive a first power supply ELVDD and a second power supply ELVSS from an external device. According to an embodiment, the second power supply ELVSS may be set to a lower voltage than the first power supply ELVDD. The pixels PXL may be selected in units of horizontal lines in response to scan signals supplied to the scan lines SL1 to SLn and receive data signals. Each pixel PXL receiving the data signal may control the amount of current flowing from the first power supply ELVDD to the second power supply ELVSS via the light emitting device OLED and generate light with predetermined brightness in response to the received data signal. Each of the pixels PXL in the pixel unit 130 shown in FIG. 1 may be a subpixel included in the unit pixel 130 shown in FIG. 1. In other words, each of the pixels PXL may be a subpixel displaying one of red, green and blue colored light.

The scan driver 110 may generate scan signals in response to control of the timing controller 150 and supply the generated scan signals to the scan lines SL1 to SLn. For example, the scan driver 110 may sequentially supply the scan signals to the scan lines SL1 to SLn.

The data driver 120 may sequentially supply a plurality of data signals to each of data output lines MD1 to MDp. For example, the data driver 120 may sequentially supply two data signals to each of the data output lines MD1 to MDp every horizontal period.

The demultiplexer 160 may be coupled to each of the data output lines MD1 to MDp. In addition, the demultiplexer 160 may be coupled to the data lines DL1 to DLm. According to an embodiment, the demultiplexer 160 may be a 4:1 demultiplexer, and the number of data lines DL1 to DLm may be four times the number of data output lines MD1 to MDp. The structure of the demultiplexer 160, the number of data lines, and the number of data output lines may vary according to embodiments.

In terms of the pixels PXL in the pixel unit 130 shown in FIG. 1, two data lines may be coupled to a single vertical line. First and third data lines DL1 and DL3 of the data lines DL1 to DLm coupled to the demultiplexer 160 may be coupled to the pixels PXL located in odd horizontal lines, and second and fourth data lines DL2 and DL4 may be coupled to the pixels PXL located in even horizontal lines. Additionally, fifth and seventh data lines DL5 and DL7 may be coupled to the pixels PXL located in even horizontal lines, and sixth and eighth data lines DL6 and DL8 may be coupled to the pixels PXL located in odd horizontal lines. In addition, adjacent odd and even data lines to each other may be alternately coupled to the pixels PXL located in the same vertical line. For example, the first and second data lines DL1 and DL2 may be alternately coupled to the pixels PXL located in the first vertical line. The connection structure of the pixels PXL is only one example according to embodiments of the present invention, and various other connection structures may be possible.

The demultiplexer 160 may sequentially supply data signals to odd data lines for a horizontal period (e.g., a predetermined horizontal period) and sequentially supply data signals to even data lines for the next horizontal period in response to a control signal from the demultiplexer controller 170.

The demultiplexer controller 170 may supply a plurality of control signals to the demultiplexer 160. The demultiplexer controller 170 may control supply of the control signals so that the data signals may be supplied in units of horizontal lines. For example, the demultiplexer controller 170 may control the supply of the control signals so that the odd data lines (DL1, DL3, DL5, . . . , DLm−1) and the even data lines (DL2, DL4, DL6, . . . , DLm) may be alternately coupled to the data output lines MD1 to MDp every horizontal period.

The timing controller 150 may control the scan driver 110, the data driver 120, and demultiplexer controller 170 in response to synchronization signals supplied from an external device. In addition, the timing controller 150 may rearrange and supply externally supplied data to the data driver 120 in response to the control signals supplied from the demultiplexer controller 170.

Figure 2:
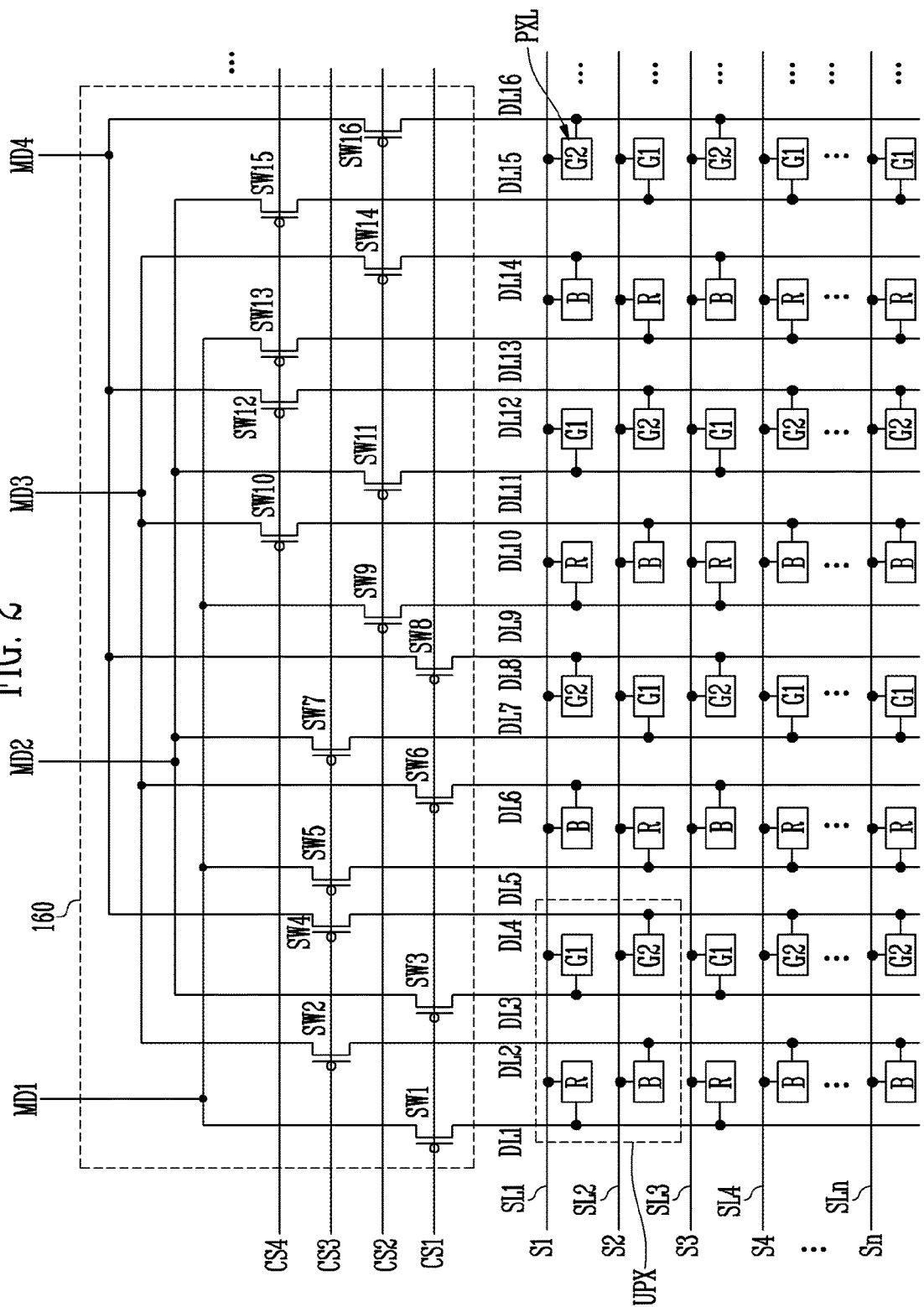
FIG. 2 is a detailed diagram illustrating a demultiplexer and a pixel unit of an example configuration of the display apparatus shown in FIG. 1.

FIG. 2 is a detailed view of a demultiplexer and a pixel unit of an example configuration of a display apparatus shown in FIG. 1. For convenience of explanation, FIG. 2 illustrates a demultiplexer coupled to the first to fourth data output lines MD1 to MD4. In addition, FIG. 2 illustrates only first to sixteenth data lines DL1 to DL16, among the data lines DL1 to DLm.

Referring to FIG. 2, the demultiplexer 160 according to an embodiment may include a first switch SW1 to a sixteenth switch SW16. Each of the first to sixteenth switches SW1 to SW16 included in the demultiplexer 160 may be coupled between a corresponding data output line and a corresponding data line. In addition, each of the pixels PXL of the pixel unit may be one of a red R pixel, a blue B pixel, a first green G1 pixel and a second green G2 pixel. As described above with reference to FIG. 2, the red R pixel, the blue B pixel, the first green G1 pixel and the second green G2 pixel may form a single unit pixel UPX. According to an embodiment, the same pixel data may be applied to the first green G1 pixel and the second green G2 included in the single unit pixel UPX, or different pixel data may be applied thereto. However, a green color of the unit pixel UPX may be displayed by the first green G1 pixel and the second green G2.

According to the embodiment shown in FIG. 2, the first to sixteenth switches SW1 to SW16 may be coupled to the first to sixteenth data lines DL1 to DL16, respectively. In addition, each of the pixels in the same vertical line may not be coupled to the same data line coupled to a neighboring pixel. In other words, two data lines corresponding to a single vertical line may be alternately coupled to pixels included in the corresponding vertical line.

The first switch SW1, the fifth switch SW5, the ninth switch SW9 and the thirteenth switch SW13 may be coupled to the first data output line MD1. Therefore, the first data line DL1, the fifth data line DL5, the ninth data line DL9 and the thirteenth data line DL13 may receive a data signal from the first data output line MD1.

The second switch SW2, the sixth switch SW6, the tenth switch SW10 and the fourteenth switch SW14 may be coupled to the third data output line MD3. Therefore, the second data line DL2, the sixth data line DL6, the tenth data line DL10 and the fourteenth data line DL14 may receive a data signal from the third data output line MD3.

The third switch SW3, the seventh switch SW7, the eleventh switch SW11 and the fifteenth switch SW15 may be coupled to the second data output line MD2. Therefore, the third data line DL3, the seventh data line DL7, the eleventh data line DL11 and the fifteenth data line DL15 may receive a data signal from the second data output line MD2.

The fourth switch SW4, the eighth switch SW8, the twelfth switch SW12 and the sixteenth switch SW16 may be coupled to the fourth data output line MD4. Therefore, the fourth data line DL4, the eighth data line DL8, the twelfth data line DL12 and the sixteenth data line DL16 may receive a data signal from the fourth data output line MD4.

The first switch SW1, the third switch SW3, the sixth switch SW6 and the eighth switch SW8 may be turned on in response to a first control signal CS1. In addition, the ninth switch SW9, the eleventh switch SW11, the fourteenth switch SW14, and the sixteenth switch SW16 may be turned on in response to a second control signal CS2. In addition, the second switch SW2, the fourth switch SW4, the fifth switch SW5, and the seventh switch SW7 may be turned on in response to a third control signal CS3. Lastly, the tenth switch SW10, the twelfth switch SW12, the thirteenth switch SW13, and the fifteenth switch SW15 may be turned on in response to a fourth control signal CS4.

First to nth scan signals S1 to Sn may be sequentially applied through the first to nth scan lines SL1 to SLn, respectively.

When the first control signal CS1 and the first scan signal S1 are applied, data may be applied to four pixels PXL located at the far left of a first horizontal line. In addition, when the second control signal and the first scan signal are applied, data may be applied to the fifth to eighth pixels PXL of the first horizontal line.

When the third control signal and the second scan signal are applied, data may be applied to the four pixels PXL located at the far left of a second horizontal line. In addition, when the fourth control signal and the second scan signal are applied, data may be applied to the fifth to eighth pixels PXL of the second horizontal line.

In other words, during a horizontal period in which the first scan signal S1 is applied, the first control signal CS1 and the second control signal CS2 may be sequentially applied, and during a horizontal period in which the second scan signal S2 is applied, the third control signal CS3 and the fourth control signal CS4 may be sequentially applied.

The data signal may be applied to the red pixels R through the first data output line MD1, and the data signal may be applied to the blue pixels B through the third data output line MD3. In addition, the data signal may be applied to first green pixels G1 through the second data output line MD2, and the data signal may be applied to the second green pixels G2 through the fourth data output line MD4.

Figure 3:
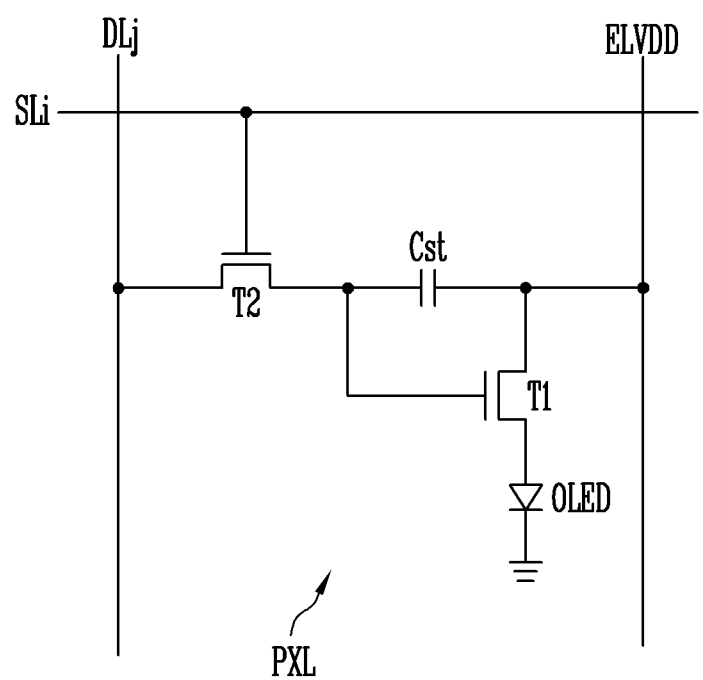
FIG. 3 is a circuit diagram illustrating the configuration of a pixel included in FIGS. 1 and 2.

FIG. 3 is a circuit diagram illustrating the structure of one of the pixels PXL included in FIGS. 1 and 2.

Referring to FIG. 3, the pixel PXL may be realized as a circuit including a first transistor T1, a second transistor T2, a storage capacitor Cst and a light emitting device OLED.

For example, FIG. 3 illustrates the pixel PXL located in an ith row (where i a natural number smaller than n) and a jth column (j is a natural number smaller than m). The pixel PXL may receive signals from a corresponding data line DLj and a corresponding scan line SLi and a power voltage from the first power supply ELVDD and the second power supply ELVSS. According to an embodiment, the second power supply ELVSS may be set to a voltage lower than that of the first power supply ELVDD. According to an example embodiment, the second power supply ELVSS may be grounded.

A gate electrode GE of the second transistor T2 may be coupled to the scan line SLi. The second transistor T2 may be turned on in response to a scan signal applied from the scan line SLi. When the second transistor T2 is turned on, the storage capacitor Cst may be charged with a voltage corresponding to a data signal applied to the data line DLj. The first transistor T1 may control the amount of current flowing through the light emitting device OLED on the basis of voltages at both ends of the storage capacitor Cst. Therefore, the light emitting device OLED may emit light with brightness corresponding to the data signal applied to the data line DLj.

Figure 4A:
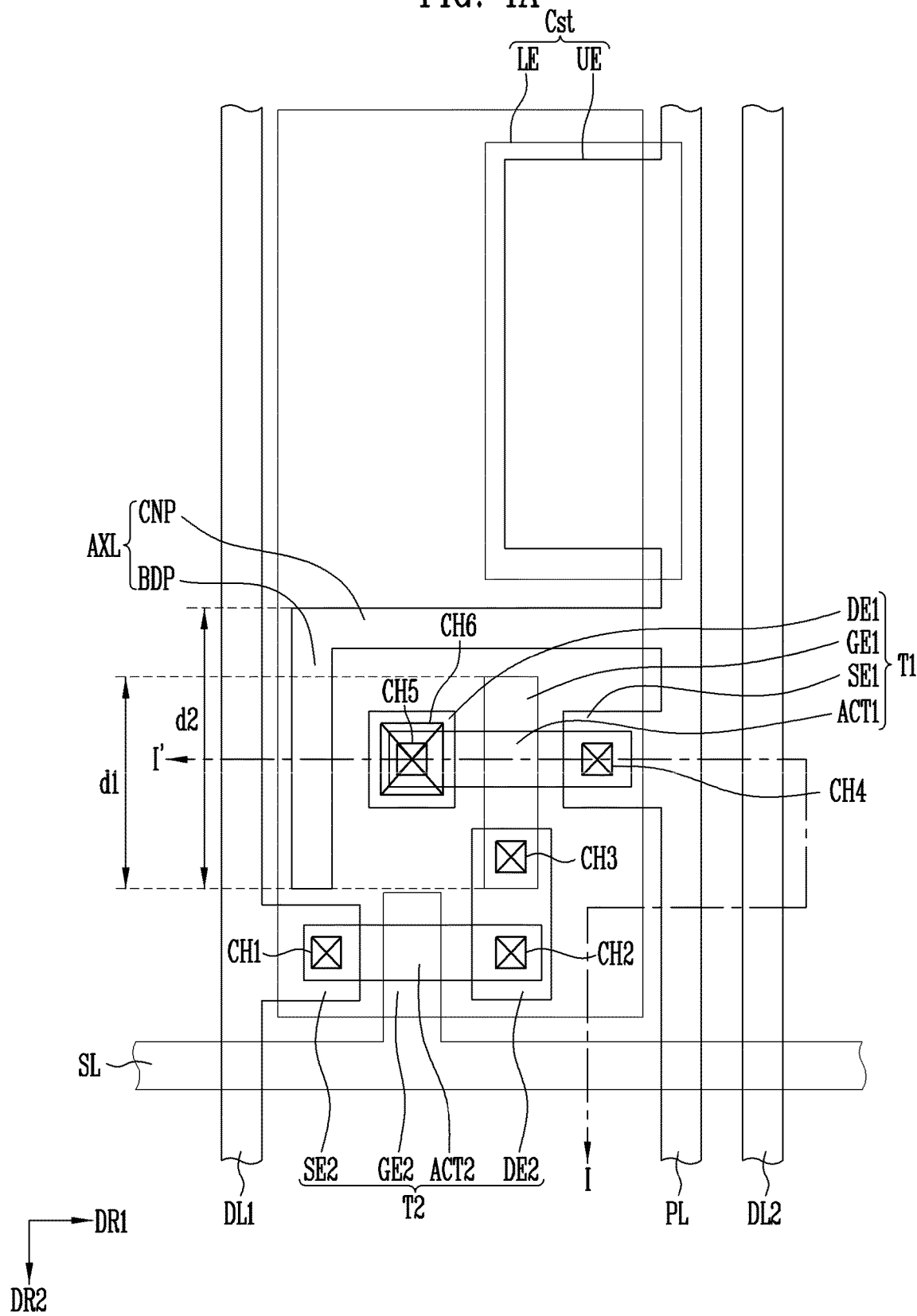
FIG. 4A is a plan view illustrating the display apparatus shown in FIG. 1.
Figure 4B:
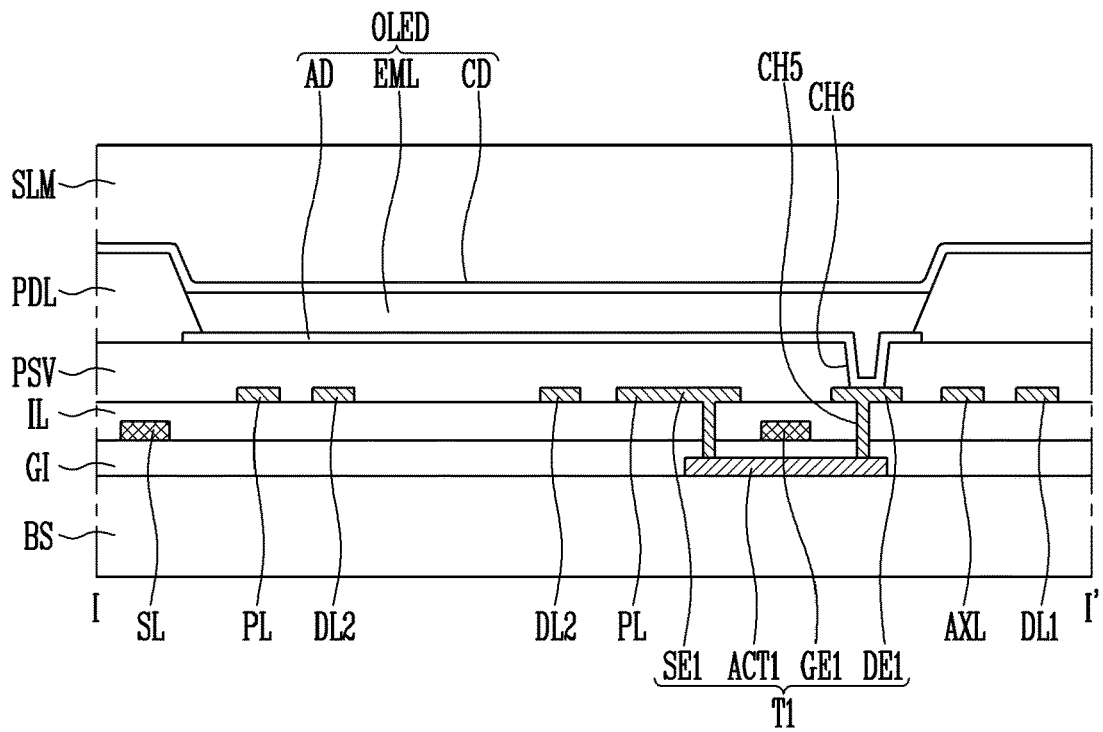
FIG. 4B is a cross-sectional diagram taken along the line I-I' of FIG. 4A.

FIG. 4A is a plan view of an implementation of a display apparatus shown in FIG. 3, and FIG. 4B is a cross-sectional view taken along line I-I' of FIG. 4A. FIGS. 4A and 4B illustrate a scan line and two adjacent data lines coupled to one pixel located in the ith row and the jth column. For convenience of explanation, in FIGS. 4A and 4B, the scan line in the ith row may be referred to as a "scan line SL," and a jth data line and a (j+1)th data line may be referred to as a "first data line DL1" and a "second data line DL2," respectively.

As illustrated in FIGS. 4A and 4B, each pixel PXL may have, for example, a rectangular shape. However, the shape of the pixel PXL may vary. In addition, the pixels PXL may have different areas from each other. For example, the pixels PXL may have different areas or shapes depending on colors.

Referring to FIGS. 4A and 4B, the display apparatus may include a base substrate BS, a wiring part and the pixels PXL.

The wiring part and the pixels PXL connected to the wiring part may be provided to the base substrate BS.

The wiring part may provide signals to each pixel PXL, the scan line SL, a data line DL, and a power supply line PL. The scan line SL may extend in a first direction DR1. The data lines DL1 and DL2 may extend in a second direction DR2 crossing the scan line SL. The power supply line PL may extend in substantially the same direction as one of the scan line SL and the data lines DL1 and DL2, for example, the data lines DL1 and DL2. The scan line SL may transmit a scan signal to a transistor, the data lines DL1 and DL2 may transmit data signals to the transistor, and the power supply line PL may provide the first power supply ELVDD (see FIG. 1) to the transistor.

The pixel PXL may include the transistor coupled to the wiring part, a display device coupled to the transistor, the storage capacitor Cst, and an auxiliary line AXL provided between at least a portion of the transistor and the wiring part.

The transistor may include a first transistor T1 driving the display device and a second transistor T2 switching the first transistor T1. In other words, the first transistor T1 may be a driving transistor, and the second transistor T2 may be a switching transistor.

The second transistor T2 may include a second gate electrode GE2, a second source electrode SE2, and a second drain electrode DE2. The second gate electrode GE2 may be coupled to the scan line SL, and the second source electrode SE2 may be coupled to the first data line DL1. The second drain electrode DE2 may be coupled to a gate electrode (e.g., first gate electrode GE1) of the first transistor T1. The second transistor T2 may transmit a data signal applied to the first data line DL1 to the first transistor T1 in response to a scan signal applied to the scan line SL.

The first transistor T1 may include a first gate electrode GE1, a first source electrode SE1 and a first drain electrode DE1. The first gate electrode GE1 may be coupled to the second transistor T2, the first source electrode SE1 may be coupled to the power supply line PL, and the first drain electrode DE1 may be coupled to the light emitting device OLED.

According to an embodiment, an example in which the light emitting device OLED is employed as a display device is described. However, according to another embodiment, a liquid crystal display device or an electrophoresis device may be used as a display device.

The light emitting device OLED may include an emitting layer EML, and an anode AD and a cathode CD opposing each other with the emitting layer EML interposed therebetween. The anode AD may be coupled to the first drain electrode DE1 of the first transistor T1. The second power supply ELVSS may be applied to the cathode CD (see FIG. 1), and the emitting layer EML may emit light in response to an output signal of the first transistor T1 and display an image by emitting light or not. The light emitted from the emitting layer EML may vary depending on the materials of the emitting layer EML, and be color light or white light.

The storage capacitor Cst may be coupled between the first gate electrode GE1 and the first source electrode SE1 and charge and maintain a data signal input to the first gate electrode GE1 of the first transistor T1.

The storage capacitor Cst may include a capacitor lower electrode LE and a capacitor upper electrode UE formed on the base substrate BS. According to an embodiment, the capacitor lower electrode LE may be floated and the capacitor upper electrode UE may be coupled to the power supply line PL. According to another example embodiment, the shape of the storage capacitor Cst may vary, and the capacitor lower electrode LE may be coupled to the gate electrode GE of the second transistor T2.

The auxiliary line AXL may be provided between the first transistor T1 (particularly, first gate electrode GE1 of the first transistor T1) and one of the two data lines DL1 and DL2.

The auxiliary line AXL may be formed to prevent parasitic capacitance that may occur between the first data line DL1 and the first transistor T1 which is the driving transistor, especially, parasitic capacitance that may occur between the first data line DL1 and the first gate electrode GE1 of the first transistor T1. A predetermined fixed voltage may be applied to the auxiliary line AXL. The auxiliary line AXL may prevent parasitic capacitance between the first data line DL1 and at least a portion of the first transistor T1, especially, the first gate electrode GE1 of the first transistor T1. Hereinafter, the first gate electrode GE1 of the first transistor T1 will be mainly described.

The auxiliary line AXL may be provided at a portion where a wiring line to which the fixed voltage is applied is not arranged, between the two adjacent data lines DL1 and DL2 with the first gate electrode GE1 of the first transistor T1 interposed therebetween. The wiring line to which the fixed voltage is applied may refer to a wiring line to which a fixed voltage having a predetermined potential is applied to thereby prevent coupling between the first gate electrode GE1 and the adjacent data lines DL1 and DL2. According to an embodiment, because the first power supply is applied to the power supply line PL, the power supply line PL may function as the wiring line to which the fixed voltage is applied. However, the invention is not limited thereto. When another wiring line to which another fixed voltage is applied exists between the first gate electrode GE1 and the adjacent data lines DL1 and DL2, the auxiliary line AXL may be provided at a portion where the corresponding line is not arranged.

Hereinafter, a description will be made based on the power supply line PL functioning as the wiring line to which the fixed voltage is applied. The power supply line PL may be provided between the first gate electrode GE1 and one of the first and second data lines DL1 and DL2, and the auxiliary line AXL may be provided between the first gate electrode GE1 and the other data line.

For example, as shown in FIG. 4B, the power supply line PL may be provided between the first gate electrode GE1 and the second data line DL2, and the auxiliary line AXL may be provided between the first gate electrode GE1 and the first data line DL1. According to another example embodiment, the power supply line PL may be provided between the first gate electrode GE1 and the first data line DL1, and the auxiliary line AXL may be provided between the first gate electrode GE1 and the second data line DL2.

According to some example embodiments, the fixed voltage may be provided at substantially the same level as a driving voltage applied to the power supply line PL. However, the level at which the fixed voltage is applied may not be limited thereto. The fixed voltage may also be provided at a level where the parasitic capacitance between the first transistor T1 and the first data line DL1 is reduced. According to some example embodiments, the auxiliary line AXL may be coupled to the power supply line PL so that the same fixed voltage as the driving voltage applied to the power supply line PL may be applied.

According to an embodiment, the auxiliary line AXL may include a body portion BDP preventing parasitic capacitance and a connection portion CNP connecting the body portion BDP and the power supply line PL.

The body portion BDP may be provided between the first data line DL1 and the first transistor T1. More specifically, the body portion BDP may be provided between the first data line DL1 and the first gate electrode GE1 of the first transistor T1.

According to some example embodiments, the body portion BDP may extend in substantially the same direction as the first data line DL1, e.g., the second direction DR2.

The body portion BDP may correspond to a length or width of the first gate electrode GE1 and be arranged between the first data line DL1 and the first gate electrode GE1 so as to prevent coupling between the first data line DL1 and the first gate electrode GE1. When the first data line DL1 is bent or inclined in a direction (e.g., a predetermined direction), or when the first gate electrode GE1 is arranged in a different direction and formed into a different shape, a direction in which the body portion BDP extends may also be determined. In other words, the direction in which the body portion BDP extends may not be limited. The body portion BDP may extend in a different direction from that shown in the drawings if the body portion BDP may prevent parasitic capacitance between the first data line DL1 and the first transistor T1, especially, the first gate electrode GE1.

According to an embodiment, the body portion BDP may be large enough to cover the first gate electrode GE1. For example, when the first gate electrode GE1 has a first length d1 in the second direction DR2, the body portion BDP may have a second length d2 in the second direction DR2 that is greater than or equal to the first length d1.

According to an embodiment, the body portion BDP may be arranged to cross imaginary lines connecting between the first data line DL1 and respective points of the first gate electrode GE1 facing the first data line DL1 by the shortest distances as viewed in a plane.

Because the body portion BDP is formed between the first data line DL1 and the first gate electrode GE1, the distance between the first data line DL1 and the auxiliary line AXL may be smaller than the distance between the first data line DL1 and the gate electrode GE of the first transistor T1.

The connection portion CNP may be provided between the power supply line PL and the body portion BDP and connect at least a portion of the body portion BDP to the power supply line PL. For example, the connection portion CNP may connect the power supply line PL to one end or the other end of the body portion BDP in the direction in which the body portion BDP extends. A portion at which the connection portion CNP is provided may vary depending on the structure of the pixel, e.g., the shapes of the body portion BDP and the power supply line PL.

Therefore, the auxiliary line AXL may be in the shape of a branch branching off from the power supply line PL, and surround the first gate electrode GE1, together with the power supply line PL. The auxiliary line AXL may be opened in a direction in which coupling between the first gate electrode GE1 and the first data line DL1 does not occur, i.e., in the opposite direction to the second direction DR2 or the second direction DR2. The auxiliary line AXL and the power supply line PL may form an open loop shape which is opened in the opposite direction to the second direction DR2 or the second direction DR2.

Hereinafter, a display apparatus according to an embodiment will be described in a stacking order.

The display apparatus according to the embodiment may include the base substrate BS on which a transistor and a display device are stacked.

According to some example embodiments of the present invention, a buffer layer may be formed on the base substrate BS. The buffer layer may prevent diffusion of impurities into the switching transistor and the second transistor T2. The buffer layer may be omitted depending on the material and processing conditions of the base substrate BS.

A first active pattern ACT1 and a second active pattern ACT2 may be provided on the buffer layer. The first active pattern ACT1 and the second active pattern ACT2 may include semiconductor materials. The first active pattern ACT1 and the second active pattern ACT2 may include doped or undoped silicon, for example, polysilicon, or amorphous silicon, and be semiconductor patterns including an oxide semiconductor. The first and second active patterns ACT1 and ACT2 may be doped with the impurities including, for example, n type impurities, p type impurities and other metals.

A gate insulating layer GI may be provided on the first active pattern ACT1 and the second active pattern ACT2.

The scan line SL, the first gate electrode GE1, the second gate electrode GE2, and the capacitor lower electrode LE may be provided over the gate insulating layer GI. The first gate electrode GE1 may be provided as a portion of the scan line SL, or protrude from the scan line SL. The first gate electrode GE1 and the second gate electrode GE2 may cover regions corresponding to channel regions of the first active pattern ACT1 and the second active pattern ACT2, respectively.

An interlayer insulating layer IL may be provided over the first and second gate electrodes GE1 and GE2 to cover the first and second gate electrodes GE1 and GE2.

The first data line DL1, the second data line DL2, the power supply line PL, the auxiliary line AXL, the first source electrode SE1, the first drain electrode DE1, the second source electrode SE2, the second drain electrode DE2, and the capacitor upper electrode UE may be provided on the interlayer insulating layer IL.

The first source electrode SE1 and the first drain electrode DE1 may contact the first active pattern ACT1 through a first contact hole CH1 and a second contact hole CH2, respectively, passing through the gate insulating layer GI and the interlayer insulating layer IL. The first drain electrode DE1 may be connected to the second gate electrode GE2 through a third contact hole CH3 passing through the interlayer insulating layer IL. The second source electrode SE2 and the second drain electrode DE2 may contact the second active pattern ACT2 through a fourth contact hole CH4 and a fifth contact hole CH5, respectively, passing through the gate insulating layer GI and the interlayer insulating layer IL.

The capacitor lower electrode LE and the capacitor upper electrode UE may form the storage capacitor Cst with the interlayer insulating layer IL interposed therebetween.

A passivation layer PSV may be provided over the base substrate BS on which the first source electrode SE1 is formed. The passivation layer PSV may serve as a protection layer protecting the first and second transistors T1 and T2, or a planarization layer planarizing upper surfaces thereof.

The anode AD of the display device may be provided on the passivation layer PSV. The anode AD may be coupled to the first drain electrode DE1 of the first transistor T1 through a sixth contact hole CH6 formed in the passivation layer PSV.

A pixel defining layer PDL may be provided over the base substrate BS on which the anode AD is formed so that the pixel defining layer PDL may divide a pixel area into a plurality of areas corresponding to the respective pixels PXL. The pixel defining layer PDL may expose an upper surface of the anode AD and protrude from the base substrate BS around the pixel PXL.

The emitting layer EML may be provided in the pixel area PA surrounded by the pixel defining layer PDL and the cathode CD may be provided on the emitting layer EML.

A sealing layer SLM may be provided on the cathode CD to cover the cathode CD.

According to an embodiment, parasitic capacitance between the first data line DL1 and the first transistor T1, i.e., the driving transistor may be minimized.

According to some related art, when a driving transistor is arranged between first and second data lines adjacent to each other, parasitic capacitance may be formed between the driving transistor, for example, a gate electrode of the driving transistor and the first and second data lines. However, a power supply line may be arranged between the driving transistor and one of the first and second data lines, e.g., the second data line. Because a fixed voltage is applied to the power supply line, parasitic capacitance may be prevented or reduced between the driving transistor and the second data line. However, because the power supply line is not arranged between the driving transistor and the other data line, i.e., the first data line, parasitic capacitance may be formed. This parasitic capacitance may cause a crosstalk defect of the display apparatus.

Figure 5:
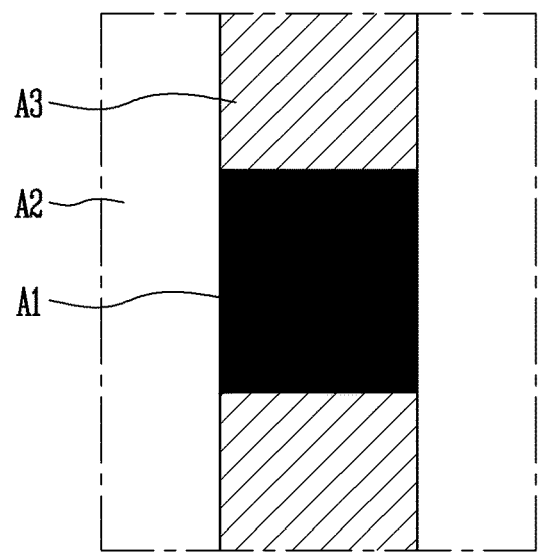
FIG. 5 is a diagram illustrating a crosstalk test pattern for checking whether crosstalk occurs in a display apparatus according to some example embodiments of the present invention.

FIG. 5 is a diagram illustrating a crosstalk test pattern for checking whether a display apparatus has a crosstalk defect.

Referring to FIG. 5, the crosstalk test pattern may include a central portion A1 having a rectangular shape and displaying black and an edge portion A2 having a rectangular ring and displaying white. In a conventional display apparatus, when the parasitic capacitance is formed, although a vertical portion A3 having a rectangular shape and located above and below the central portion A1 is to display white, gray may be displayed, i.e., a vertical crosstalk defect may occur.

This vertical crosstalk defect may occur due to the following reasons.

When the test pattern is formed, a data signal corresponding to white may be applied to a first gate electrode of a first transistor (e.g., a driving transistor) of each pixel corresponding to the vertical portion A3, and subsequently, a data signal corresponding to black may be applied to the first gate electrode of the first transistor of each pixel corresponding to the central portion A1. However, when coupling occurs between the first data line and the first transistor (for example, first gate electrode), for example, when coupling occurs between the data signal corresponding to black in the first data line of the vertical portion A3 and the data signal corresponding to white and applied to the first gate electrode of the vertical portion A3, the data signal applied to the first gate electrode of the vertical portion A3 may be reduced, and brightness of the light emitting device may be accordingly. The reduction in brightness of the light emitting device may cause the pixel to display gray instead of white.

In the display apparatus according to the embodiment, because the auxiliary line preventing parasitic capacitance between the first data line and the first transistor, especially, between the first data line and the first gate electrode is provided between the first data line and the first gate electrode, vertical crosstalk may be avoided. Therefore, display quality of the display apparatus according to an embodiment may be relatively improved.

According to an embodiment, it is illustrated that the display apparatus includes a demultiplexer. However, the invention is limited thereto. In related art pixels having various structures, a crosstalk defect may occur when there is a small distance between the driving transistor and the two data lines, or no separate shielding structure exists. Crosstalk may be avoided by using the auxiliary line according to an embodiment. Recently, given that high precision of a display apparatus is being performed, coupling between neighboring data lines may be unavoidable or common. By using the above-described auxiliary line in the display apparatus, a high-quality display apparatus preventing or reducing instances of a crosstalk defect may be implemented.

Figure 6:
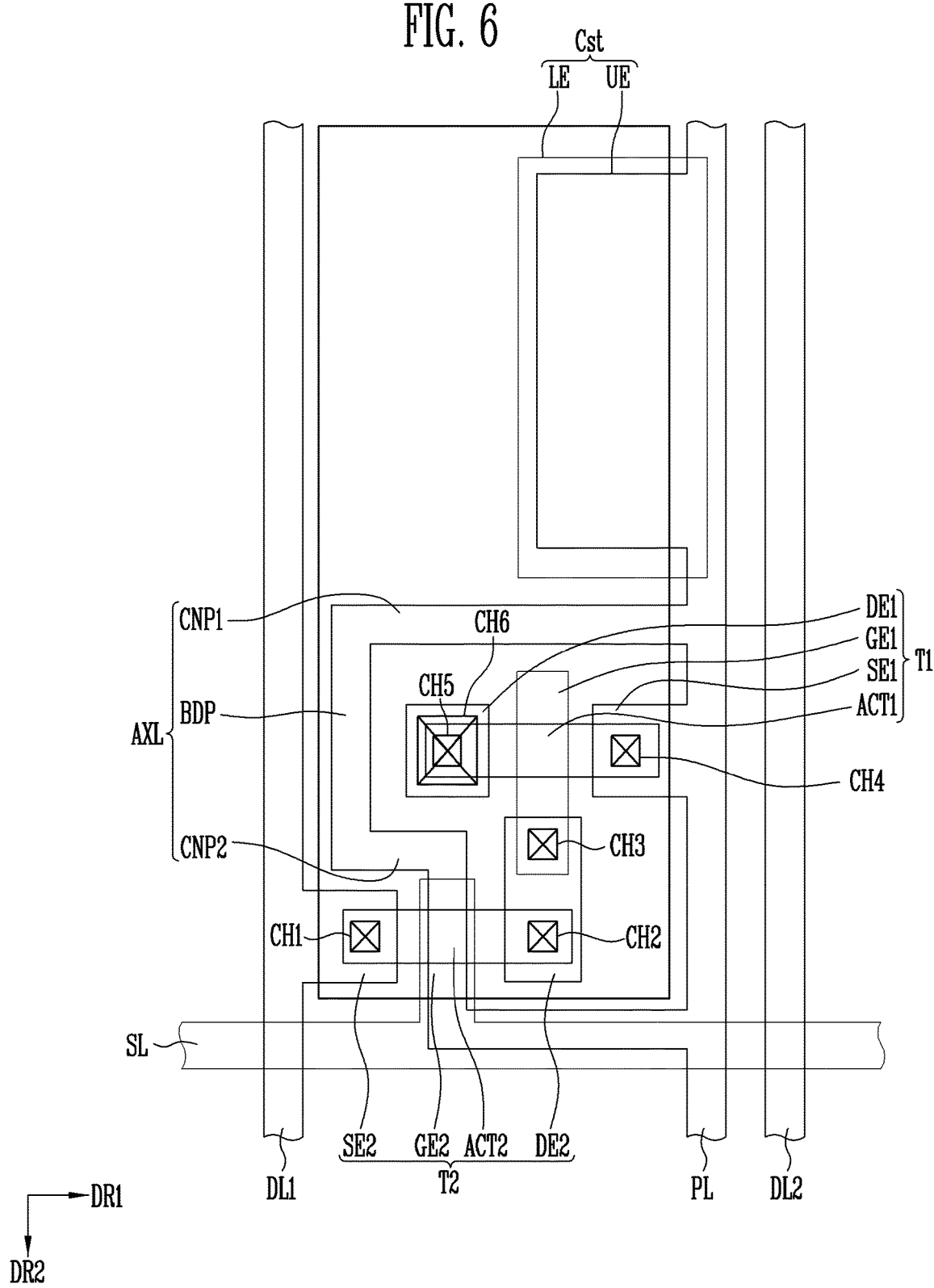
FIG. 6 is a plan view illustrating another embodiment of a display apparatus shown in FIG. 3.

According to an embodiment, the auxiliary line may have various shapes. FIG. 6 is a plan view illustrating another embodiment of the display apparatus shown in FIG. 3. Because this embodiment has substantially the same or similar structure as that shown in FIGS. 4A, 4B and 5, except an auxiliary line, certain detailed description thereof may be omitted and differences in terms of the auxiliary line will be mainly described.

Referring to FIG. 6, a display apparatus according to another embodiment may include an auxiliary line having a closed loop shape.

According to this embodiment, the auxiliary line AXL may include the body portion BDP preventing parasitic capacitance between the first gate electrode GE1 of the first transistor T1 and the data line DL, a first connection portion CNP1 connecting the body portion BDP and the power supply line PL, and a second connection portion CNP2.

The body portion BDP may be provided between the first data line DL1 and the first transistor T1. More specifically, the body portion BDP may be provided between the first data line DL1 and the first gate electrode GE1 of the first transistor T1.

According to an embodiment, the body portion BDP may extend in substantially the same direction as the first data line DL1, i.e., the second direction DR2.

The body portion BDP may correspond to a length or width of the first gate electrode GE1 and be arranged between the first data line DL1 and the first gate electrode GE1 so as to prevent coupling between the first data line DL1 and the first gate electrode GE1.

According to an embodiment, the body portion BDP may be large enough to cover the first transistor T1.

The first connection portion CNP1 may be provided between the power supply line PL and the body portion BDP and connect one end of the body portion BDP in a longitudinal direction to the power supply line PL. The second connection portion CNP2 may be provided between the power supply line PL and the body portion BDP and connect the other end of the body portion BDP in the longitudinal direction to the power supply line PL.

Both ends of the power supply line PL, the first connection portion CNP1, the body portion BDP, and the second connection portion CNP2 may be sequentially connected to each other to form a closed loop shape.

According to an embodiment, because the power supply line PL is connected to the auxiliary line AXL, a fixed voltage (e.g., first power supply) applied to the power supply line PL may be applied. Therefore, the auxiliary line AXL may prevent coupling between the first gate electrode GE1 and the first and second data lines DL1 and DL2. The first gate electrode GE1 may be connected to the second drain electrode DE2 of the second transistor T2. Because the auxiliary line AXL has the closed loop shape, the auxiliary line AXL may effectively shield the second drain electrode DE2 and/or a connecting portion between the second drain electrode DE2 and the first gate electrode GE1.

According to an embodiment, a description is made to an example in which one pixel includes two transistors and one storage capacitor. However, the invention is not limited thereto. For example, according to another embodiment, a single transistor may be provided, and an auxiliary line preventing coupling between the transistor and neighboring data lines may be provided. The display apparatus may include a scan line extending in a first direction, first and second data lines extending in a second direction crossing the first direction, and a fixed voltage line to which a fixed voltage is applied. The transistor may be connected to the scan line and the first data line. The auxiliary line may be provided between at least a portion of the transistor and one of the first and second data lines, and a fixed voltage may be applied thereto. The fixed voltage line may be provided between the transistor and the other data line, and the fixed voltage may be applied thereto.

In addition, according to another embodiment, one pixel may include one transistor, and one pixel may include at least three transistors, for example, six or seven transistors. The number of storage capacitors may also change.

Figure 7:
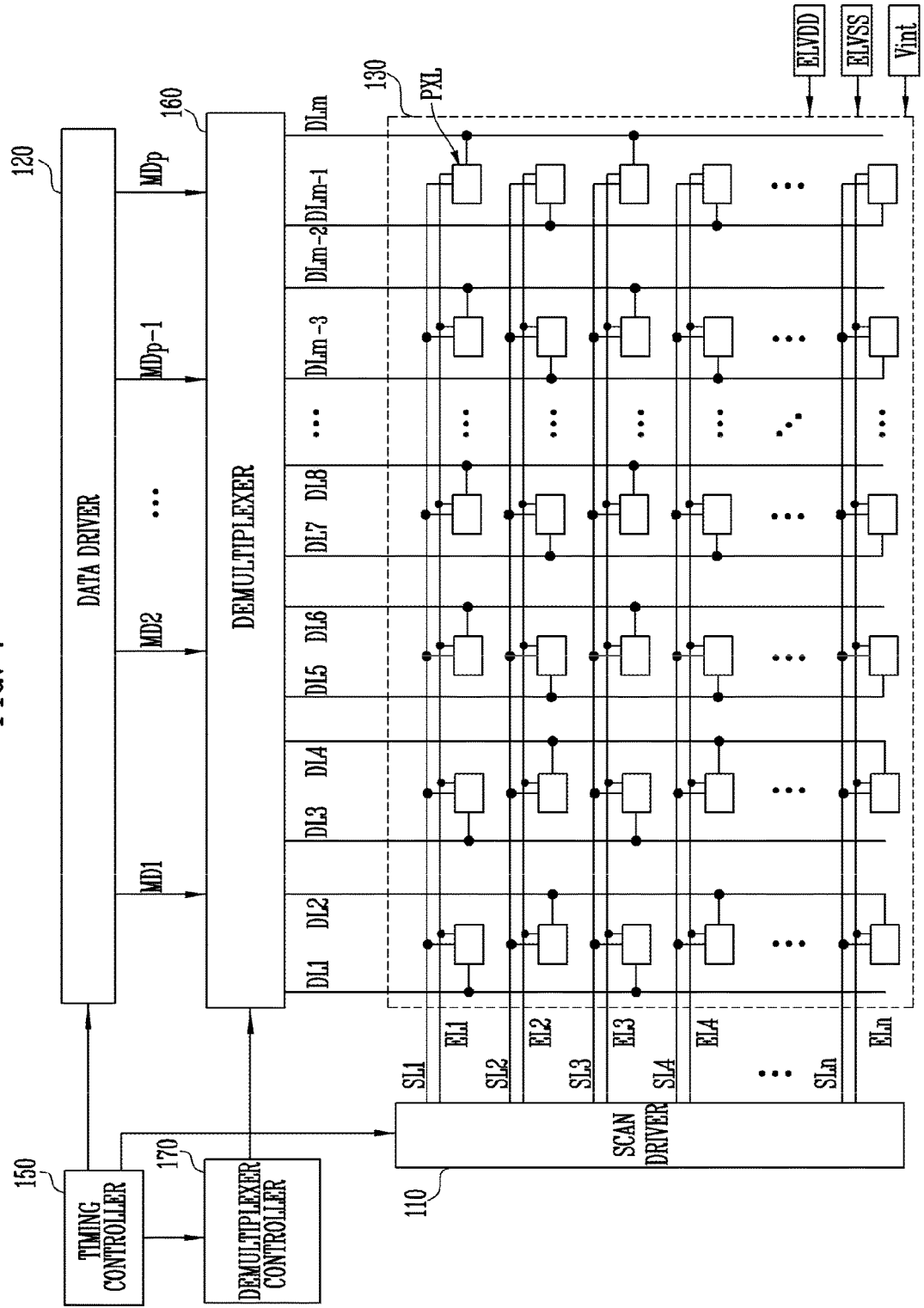
FIG. 7 is a diagram illustrating a display apparatus according to some example embodiments of the present invention.

FIG. 7 is a diagram illustrating a display apparatus according to another embodiment.

Referring to FIG. 7, the display apparatus may include the scan driver 110, the data driver 120, the pixel unit 130 including the pixels PXL, the timing controller 150, the demultiplexer 160, and the demultiplexer controller 170.

The display apparatus shown in FIG. 7 may have the same configuration as the display apparatus shown in FIG. 1, except the scan driver 110 and the pixels PXL. In the display apparatus shown in FIG. 7, the scan driver 110 may generate scan signals in response to control of the timing controller 150 and supply the generated scan signals to the scan lines SL1 to SLn. For example, the scan driver 110 may sequentially supply the scan signals to the scan lines SL1 to SLn. In addition, the scan driver 110 may generate light emission control signals in response to control of the timing controller 150 and supply the generated light emission control signals to light emission control lines EL1 to ELn. The pixels PXL shown in FIG. 7 may be connected to data lines, scan lines and light emission control lines corresponding thereto. The pixels PXL may receive an initialization power supply Vint from an external device in addition to the first power supply ELVDD and the second power supply ELVSS.

Figure 8:
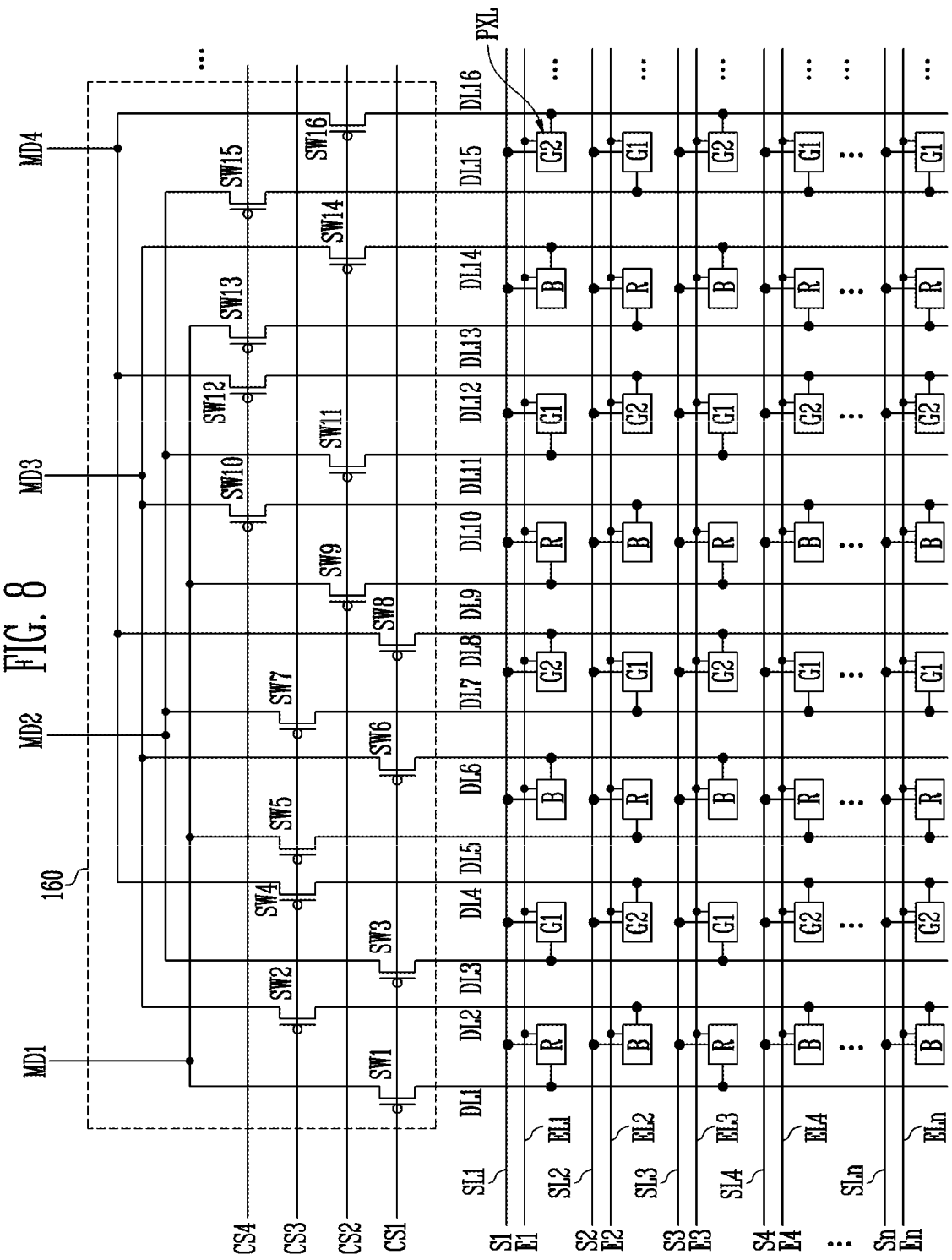
FIG. 8 is a detailed view illustrating a demultiplexer and a pixel unit of an example configuration of the display apparatus shown in FIG. 7.

FIG. 8 is a detailed circuit diagram illustrating a demultiplexer and a pixel unit of the example configuration of the display apparatus shown in FIG. 7. For convenience of explanation, FIG. 8 illustrates the demultiplexer coupled to the first to fourth data output lines MD1 to MD4. In addition, FIG. 8 illustrates only the first to sixteenth data lines DL1 to DL16, among the data lines DL1 to DLm.

Referring to FIG. 8, the demultiplexer 160 according to an embodiment may include first to sixteenth switches SW1 to SW16. Each of the first to sixteenth switches SW1 to SW16 included in the demultiplexer 160 may be coupled between a corresponding data output line and a corresponding data line corresponding. In addition, each of the pixels PXL of the pixel unit may be one of a red (R) pixel, a blue (B) pixel, a first green (G1) pixel and a second green (G2) pixel. The red (R) pixel, the blue (B) pixel, the first green (G1) pixel and the second green (G2) pixel may form the single unit pixel UPX. According to an embodiment, the same pixel data may be applied to the first green G1 pixel and the second green G2 included in the single unit pixel UPX, or different pixel data may be applied thereto. However, a green color of the unit pixel UPX may be displayed by the first green G1 pixel and the second green G2.

In the embodiment shown in FIG. 8, the first to sixteenth switches SW1 to SW16 may be coupled to the first to sixteenth data lines DL1 to DL16, respectively. In addition, each of the pixels in the same vertical line may not be connected to the same data line as a neighboring pixel. In other words, two data lines corresponding to one vertical line may be alternately connected to pixels included in the corresponding vertical line.

Because the connections between the first to sixteenth switches SW1 to SW16 and the first to sixteenth data lines DL1 to DL16 shown in FIG. 8 are the same as those shown in FIG. 2, a detailed description thereof will be omitted.

Each of the pixels PXL shown in FIG. 8 may be coupled to a corresponding data line, a corresponding scan line and a corresponding light emission control line.

Figure 9:
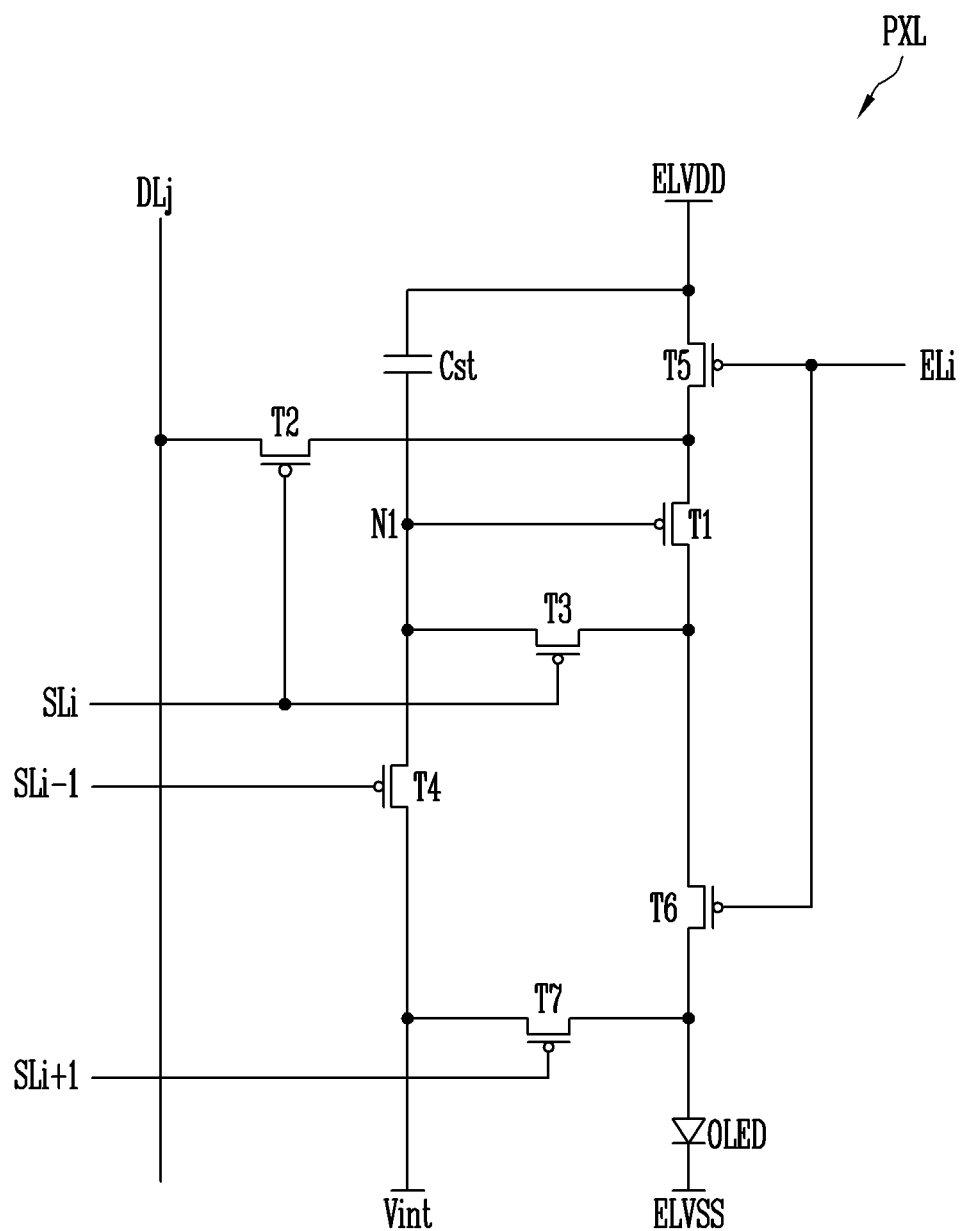
FIG. 9 is a view illustrating an embodiment of the pixel shown in FIGS. 7 and 8.

FIG. 9 is a circuit diagram illustrating an embodiment of a pixel shown in FIGS. 7 and 8. FIG. 9 illustrates the pixel PXL located in an ith row (i is a natural number smaller than n) and a jth column (j is a natural number smaller than m). The pixel PXL according to the embodiment may include the light emitting device OLED, the first to seventh transistors T1 to T7 and the storage capacitor Cst.

An anode of the light emitting device OLED may be coupled to the first transistor T1 via the sixth transistor T6, and a cathode thereof may be coupled to the second power supply ELVSS. The light emitting device OLED may generate light with predetermined brightness corresponding to the amount of current supplied from the first transistor T1.

The first power supply ELVDD may be set to a voltage greater than the second power supply ELVSS so that current may flow through the light emitting device OLED.

The seventh transistor T7 may be connected between the initialization power supply Vint and the anode of the light emitting device OLED. In addition, a gate electrode of the seventh transistor T7 may be connected to an (i+1)th scan line SLi+1. The seventh transistor T7 may be turned on when an (i+1)th scan signal is supplied to the (i+1)th scan line SLi+1 to supply so that a voltage of the initialization power supply Vint may be supplied to the anode of the light emitting device OLED. The initialization power supply Vint may be set to a lower voltage than a data signal.

The sixth transistor T6 may be coupled between the first transistor T1 and the light emitting device OLED. In addition, a gate electrode of the sixth transistor T6 may be coupled to an ith light emission control line ELi. The sixth transistor T6 may be turned off when an ith light emission control signal is supplied to the ith light emission control line ELi, and turned on for the remaining period.

The fifth transistor T5 may be coupled between the first power supply ELVDD and the first transistor T1. In addition, a gate electrode of the fifth transistor T5 may be coupled to the ith light emission control line ELi. The fifth transistor T5 may be turned off when the ith light emission control signal is supplied to the ith light emission control line Eli, and turned on for the remaining period.

A first electrode of the first transistor T1 which is a driving transistor may be coupled to the first power supply ELVDD via the fifth transistor T5. A second electrode thereof may be coupled to the anode of the light emitting device OLED via the sixth transistor T6. In addition, a gate electrode of the first transistor T1 may be coupled to a first node N1. The first transistor T1 may control the amount of current flowing from the first power supply ELVDD to the second power supply ELVSS via the light emitting device OLED in response to a voltage of the first node N1.

The third transistor T3 may be coupled between a second electrode of the first transistor T1 and the first node N1. In addition, a gate electrode of the third transistor T3 may be coupled to an ith scan line SLi. The third transistor T3 may be turned on when an ith scan signal is supplied to the ith scan line SLi so as to electrically connect the second electrode of the first transistor T1 to the first node N1. Therefore, when the transistor T3 is turned on, the first transistor T1 may be connected as a diode.

The fourth transistor T4 may be coupled between the first node N1 and the initialization power supply Vint. A gate electrode of the fourth transistor T4 may be coupled to an (i−1)th scan line SLi−1. The fourth transistor T4 may be turned on when an (i−1)th scan signal is supplied to the (i−1)th scan line SLi−1 so that the voltage of the initialization power supply Vint may be supplied to the first node N1.

The second transistor T2 may be coupled between a jth data line DLj and the first electrode of the first transistor T1. In addition, a gate electrode of the second transistor T2 may be coupled to the ith scan line SLi. The second transistor T2 may be turned on when a scan signal is supplied to the ith scan line SLi so as to electrically connect the jth data line DLj to the first electrode of the first transistor T1.

The storage capacitor Cst may be coupled between the first power supply ELVDD and the first node N1. The storage capacitor Cst may store a jth data signal and a voltage corresponding to the threshold voltage of the first transistor T1.

Figure 10:
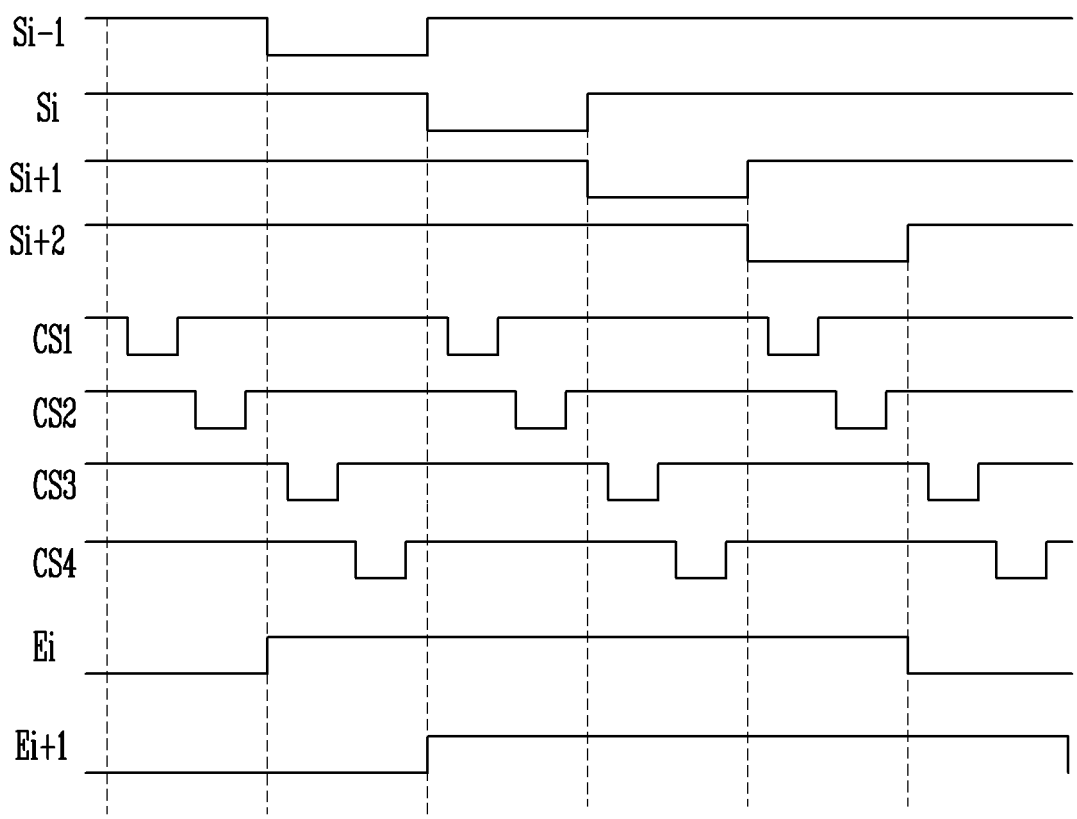
FIG. 10 is a waveform view illustrating the demultiplexer shown in FIG. 8 and a method of driving the pixel shown in FIG. 9.

FIG. 10 is a waveform view illustrating a method of driving a demultiplexer shown in FIG. 9 and a pixel shown in FIG. 10.

Referring to FIGS. 8 to 10, (i−1)th to (i+2)th scan signals Si−1 to Si+2 may be sequentially applied. Meanwhile, the first and second control signals CS1 and CS2 may be sequentially applied during a horizontal period in which an (i−1)th scan signal Si−1 is applied. In addition, during a horizontal period in which the ith scan signal Si is applied, the third and fourth control signals CS3 and CS4 may be sequentially applied. Subsequently, during a horizontal period in which the (i−1)th scan signal Si−1 is applied, the first and second control signals CS1 and CS2 may be sequentially applied again. In addition, during a horizontal period in which an (i+2)th scan signal Si+2 is applied, the third and fourth control signals CS3 and CS4 may be sequentially applied.

First, an ith light emission control signal Ei may be supplied to the ith light emission control line ELi. When the light emission control signal Ei is supplied to the ith light emission control line Eli, the sixth transistor T6 and the fifth transistor T5 may be turned off.

When the fifth transistor T5 is turned off, the first power supply ELVDD and the first electrode of the first transistor T1 may be electrically disconnected from each other. When the sixth transistor T6 is turned off, the second electrode of the first transistor T1 and the anode of the light emitting device OLED may be electrically disconnected from each other. Therefore, during a period in which the light emission control signal Ei is supplied to the ith light emission control line ELi, the pixel PXL may be set to a non-light emitting state.

Hereinafter, the (i−1)th scan signal Si−1 may be supplied to the (i−1)th scan line SLi−1. When the (i−1)th scan signal Si−1 is supplied to the (i−1)th scan line SLi−1, the fourth transistor T4 may be turned on. When the fourth transistor T4 is turned on, the voltage of the initialization power supply Vint may be supplied to the first node N1.

After the (i−1)th scan signal Si−1 is supplied to the (i−1)th scan line SLi−1, the ith scan signal Si may be supplied to the ith scan line SLi. When the ith scan signal Si is supplied to the ith scan line SLi, the third transistor T3 and the second transistor T2 may be turned on.

When the third transistor T3 is turned on, the first node N1 and the second electrode of the first transistor T1 may be electrically connected to each other. In other words, when the third transistor T3 is turned on, the first transistor T1 may be connected as a diode.

When the second transistor T2 is turned on, a jth data signal Dj may be supplied to the first electrode of the first transistor T1 from the jth data line DLj. Because the first node N1 is initialized to the voltage of the initialization power supply Vint, the first transistor T1 may be turned on. When the first transistor T1 is turned on, a voltage obtained by subtracting an absolute value of the threshold voltage of the first transistor T1 from a voltage of the jth data signal Dj may be supplied to the first node N1. The storage capacitor Cst may store the jth data signal Dj and a voltage corresponding to the threshold voltage of the first transistor T1.

The (i+1)th scan signal Si+1 may be supplied to the (i+1)th scan line SLi+1. When the (i+1)th scan signal Si+1 is supplied to the (i+1)th scan line SLi+1, the seventh transistor T7 may be turned on. When the seventh transistor T7 is turned on, the voltage of the initialization power supply Vint may be applied to the anode of the light emitting device OLED, the parasitic capacitance of the light emitting device OLED may be discharged.

After the (i+1)th scan signal Si+1 is supplied to the (i+1)th scan line SLi+1, supply of the ith light emission control signal Ei to the ith light emission control line ELi may be stopped. When the supply of the ith light emission control signal Ei to the ith light emission control line ELi is stopped, the sixth transistor T6 and the fifth transistor T5 may be turned on. When the fifth transistor T5 is turned on, the first power supply ELVDD and the first electrode of the first transistor T1 may be electrically connected to each other. When the sixth transistor T6 is turned on, the second electrode of the first transistor T1 and the anode of the light emitting device OLED may be electrically connected to each other.

The first transistor T1 may control the amount of current flowing from the first power supply ELVDD to the second power supply ELVSS via the light emitting device OLED in response to the voltage of the first node N1. The light emitting device OLED may generate light with predetermined brightness in response to the amount of current supplied from the first transistor T1. Actually, the pixels PXL may repeat the above-described processes and generate light with brightness corresponding to data signals.

As described above, the display apparatus according to an embodiment may temporally divide a period during which data is applied to data lines and a period during which a data signal and a voltage corresponding to a threshold voltage of a first transistor are stored in a storage capacitor. Because a sufficient amount of time for a period in which the threshold voltage of the first transistor T1 is compensated for is ensured, stain caused by high resolution may be reduced.

Figure 11:
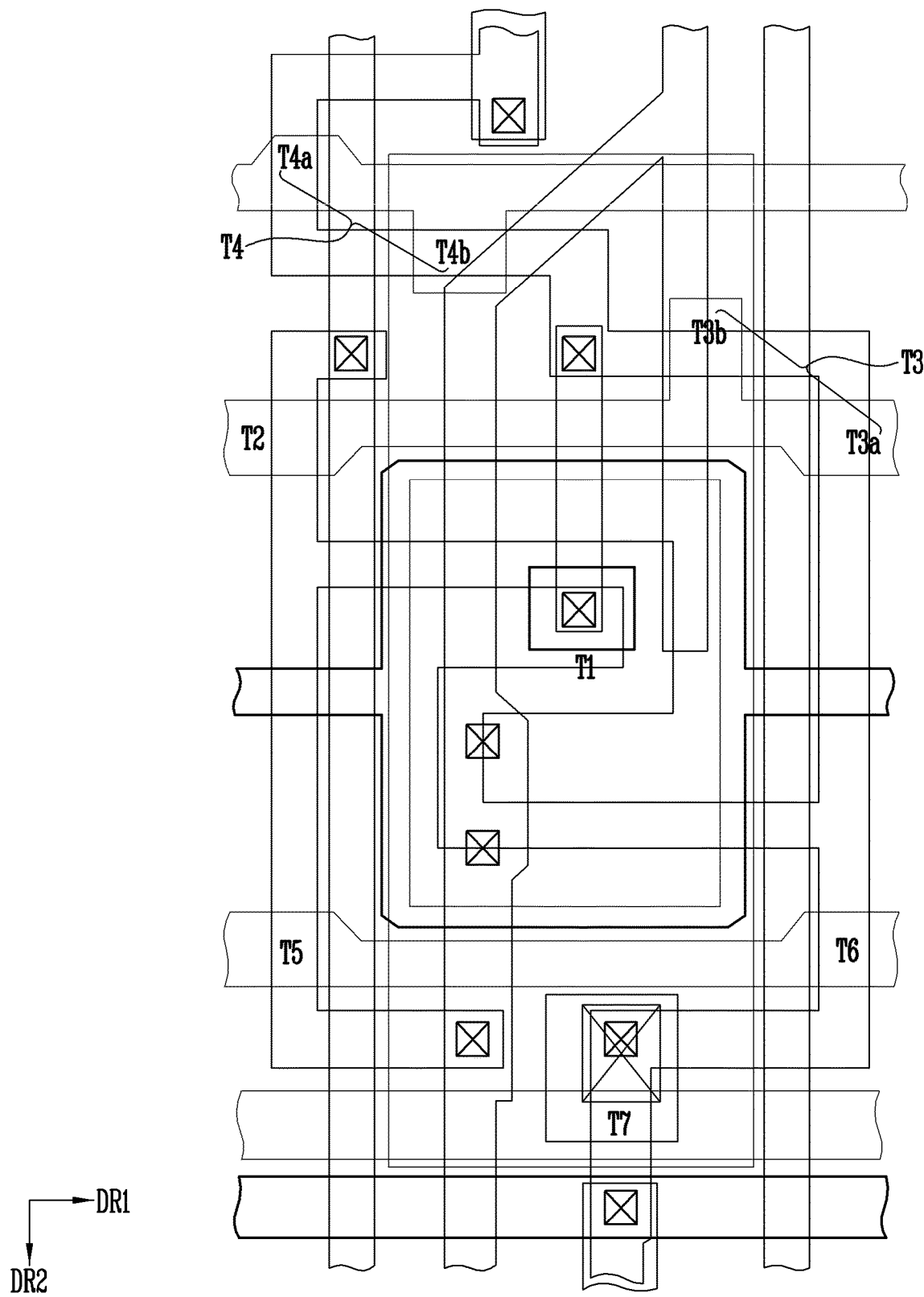
FIG. 11 is a plan view of an implementation of the pixel shown in FIG. 9 and showing the location of each transistor according to some example embodiments of the present invention.
Figure 12A:
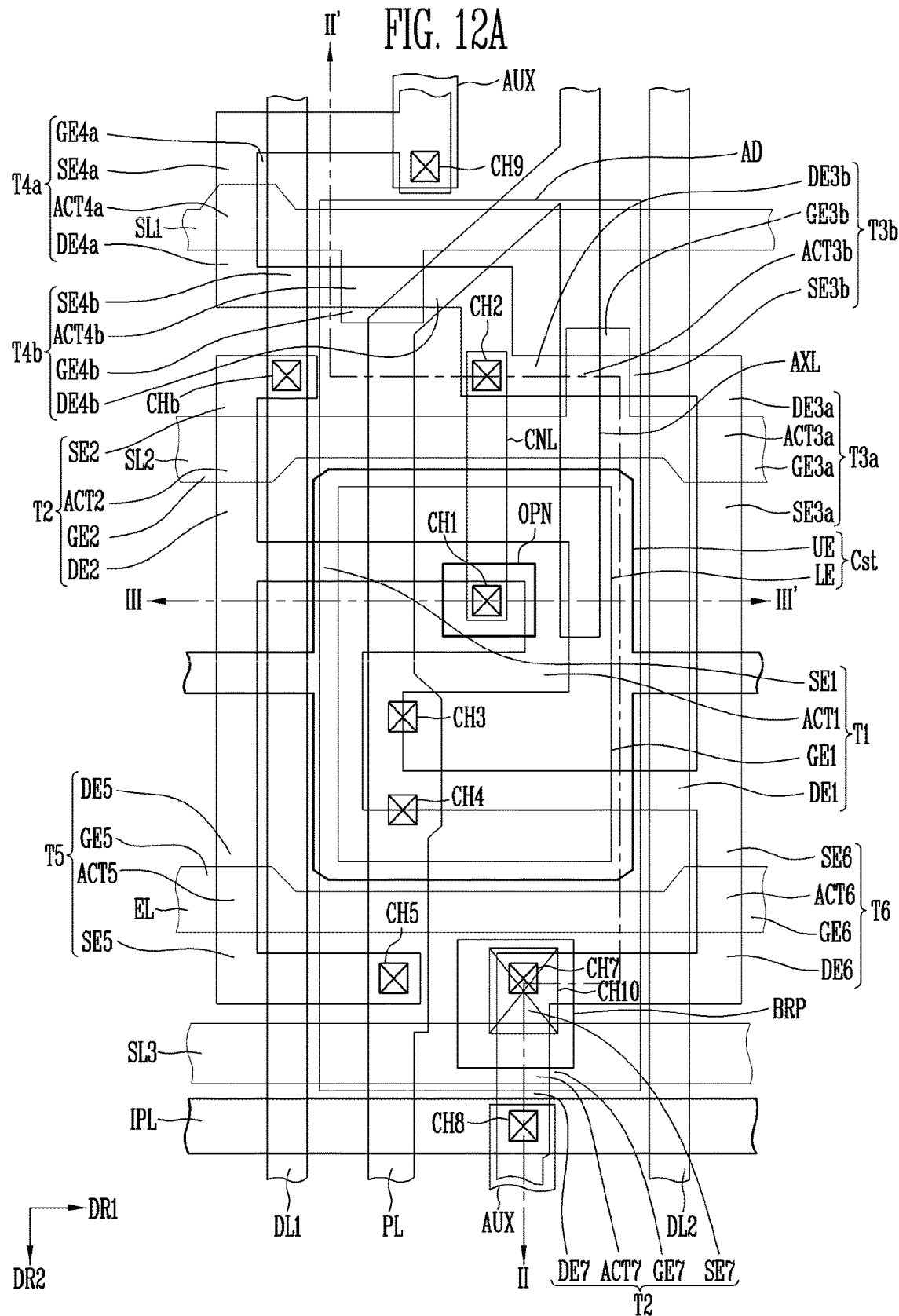
FIG. 12A is a detailed plan view of the pixel shown in FIG. 11.
Figure 12B:
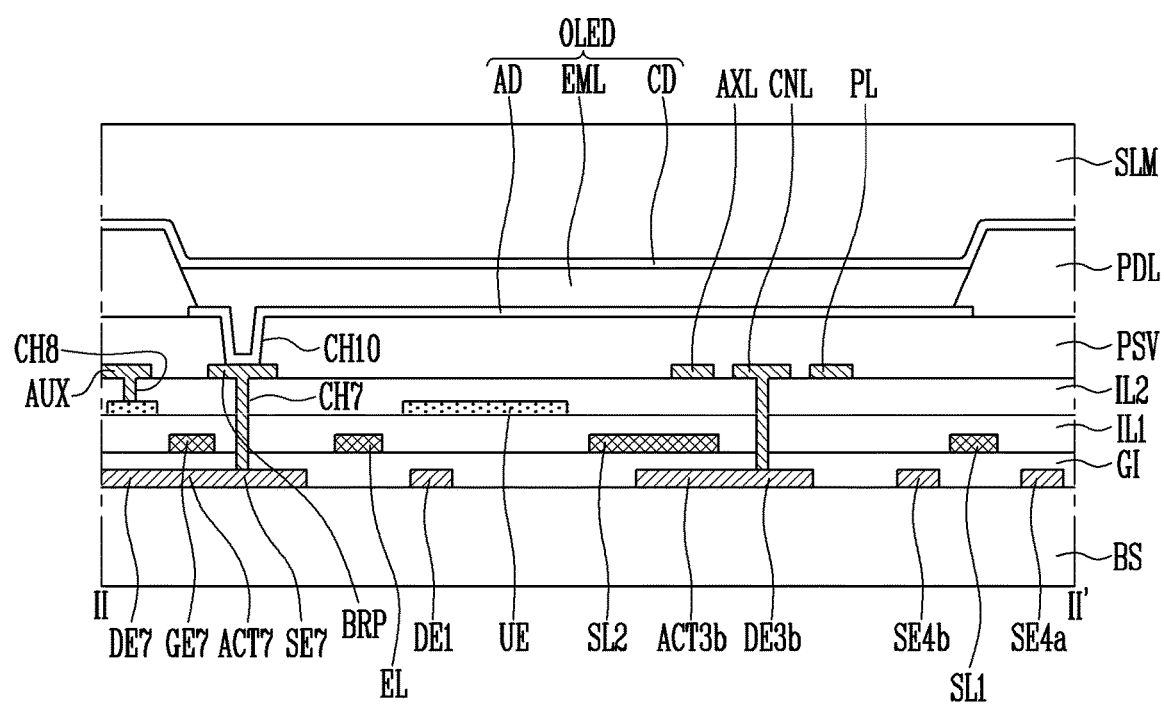
FIG. 12B is a cross-sectional view taken along the line II-II' of FIG. 12A.
Figure 12C:
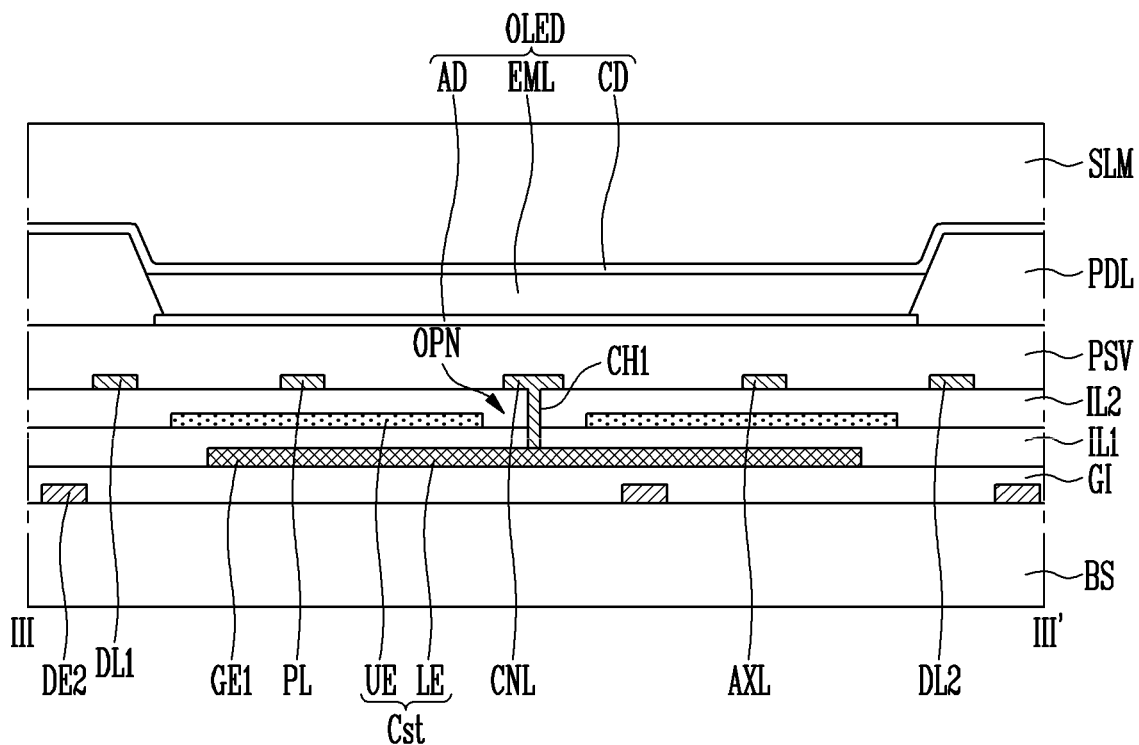
FIG. 12C is a cross-sectional view taken along the line III-III' of FIG. 12A.

FIG. 11 is a plan view of an implementation of a pixel shown in FIG. 9 and showing the positions of respective transistors. FIG. 12A is a detailed plan view of a pixel shown in FIG. 11. FIG. 12B is a cross-sectional view taken along the line II-II' of FIG. 12A. FIG. 12C is a cross-sectional view taken along the line III-III' of FIG. 12A. In FIGS. 11, 12A and 12C, on the basis of one pixel arranged in an ith row and a jth column, scan lines, a light emission control line, a power supply line, and two adjacent data lines connected to the pixel are illustrated. For the purpose of convenience, FIGS. 12A and 12C, a scan line in an (i−1)th row may be referred to as by a "first scan line SL1," a scan line in an ith row may be referred to as a "second scan line SL2," a scan line in an (i+1)th row may be referred to as by a "third scan line SL3," a data line in a jth column may be referred to as by a "first data line DL1," a data line in a (j+1)th column may be referred to as a "second data line DL2," a light emission control line in the ith row may be referred to as a "light emission control line EL," and a jth power supply line may be referred to as a "power supply line PL."

Referring to FIGS. 11, 12A and 12C, the display apparatus may include the base substrate BS, the wiring part and the pixels PXL.

The wiring part may supply a signal to each pixel PXL and include scan lines, data lines, the light emission control line EL, the power supply line PL and an initialization power supply line IPL.

The scan lines may include the first scan line SL1, the second scan line SL2, and the third scan line SL3 that extend in the first direction DR1 and are sequentially arranged in the second direction DR2. Scan signals may be applied to the scan lines. The (i−1)th scan signal may be applied to the first scan line SL1, an ith scan signal may be applied to the second scan line SL2, and an (i−1)th scan signal may be applied to the third scan line SL3.

The light emission control line EL may extend in the first direction DR1 and be arranged between and separated from the second scan line SL2 and the third scan line SL3. A light emission control signal may be applied to the light emission control line EL.

The data lines may include the first data line DL1 and the second data line DL2 that extend in the second direction DR2 and are sequentially arranged in the first direction DR1. Data signals may be applied to the data lines DL. The jth data signal and a (j+1)th data signal may be applied to the first data line DL1 and the second data line DL2, respectively.

The power supply line PL may extend in the second direction DR2 and be arranged between and separated from the first data line DL1 and the second data line DL2. Although the power supply line PL may be partially bent to be inclined with respect to the second direction DR2, the power supply line PL may be arranged to extend in the second direction DR2. A first power supply may be applied to the power supply line PL.

The initialization power supply line IPL may extend in the first direction DR1 and be provided between the third scan line SL3 and the first scan line SL1 of a pixel in the next row. An initialization power supply may be applied to the initialization power supply line IPL.

Each pixel may include the first to seventh transistors T1 to T7, the storage capacitor Cst, the light emitting device OLED and the auxiliary line AXL.

The first transistor T1 may include the first gate electrode GE1, the first active pattern ACT1, the first source electrode SE1, the first drain electrode DE1 and a connection line CNL.

The first gate electrode GE1 may be coupled to a third drain electrode DE3 of the third transistor T3 and a fourth drain electrode DE4 of the fourth transistor T4. The connection line CNL may connect the first gate electrode GE1 and the third and fourth drain electrodes DE3 and DE4. One end of the connection line CNL may be coupled to the first gate electrode GE1 through the first contact hole CH1 and the other end thereof may be coupled to the third drain electrode DE3 and the fourth drain electrode DE4 through the second contact hole CH2.

According to an embodiment, each of the first active pattern ACT1 and the first source and drain electrodes SE1 and DE1 may include a semiconductor layer that is doped, or not, with impurities. The first source electrode SE1 and the first drain electrode DE1 may include a semiconductor layer doped with impurities, and the first active pattern ACT1 may include a semiconductor layer not doped with impurities.

The first active pattern ACT1 may have a bar shape extending in a predetermined direction and be bent a plurality of times in a longitudinal direction. The first active pattern ACT1 may overlap with the first gate electrode GE1 as viewed in a plane. Because the first active pattern ACT1 extends in the longitudinal direction, a channel region of the first transistor T1 may correspondingly extend in the longitudinal direction. Therefore, a driving range of a gate voltage applied to the first transistor T1 may be broadened. Therefore, grayscale of light emitted from the light emitting device OLED may be minutely controlled.

The first source electrode SE1 may be coupled to one end of the first active pattern ACT1, the second drain electrode DE2 of the second transistor T2 and a fifth drain electrode DE5 of the fifth transistor T5. The first drain electrode DE1 may be coupled to the other end of the first active pattern ACT1, a third source electrode SE3 of the third transistor T3 and a sixth source electrode SE6 of the sixth transistor T6.

The second transistor T2 may include the second gate electrode GE2, the second active pattern ACT2, the second source electrode SE2, and the second drain electrode DE2.

The second gate electrode GE2 may be coupled to the second scan line SL2. The second gate electrode GE2 may be provided as a portion of the second scan line SL2, or protrude from the second scan line SL2. According to an embodiment, each of the second active pattern ACT2, the second source electrode SE2 and the second drain electrode DE2 may include a semiconductor layer that is doped, or not, with impurities. The second source electrode SE2 and the second drain electrode DE2 may include a semiconductor layer doped with impurities. The second active pattern ACT2 may include a semiconductor layer not doped with impurities. The second active pattern ACT2 may correspond to an overlapping portion with the second gate electrode GE2. One end of the second source electrode SE2 may be coupled to the second active pattern ACT2 and the other end thereof may be coupled to the first data line DL1 through the sixth contact hole CH6. One end of the second drain electrode DE2 may be coupled to the second active pattern ACT2 and the other end thereof may be coupled to the first source electrode SE1 of the first transistor T1 and the fifth drain electrode DE5 of the fifth transistor T5.

The third transistor T3 may include a dual gate structure in order to prevent leakage current. In other words, the third transistor T3 may include a 3a-th transistor T3a and a 3b-th transistor T3b. The 3a-th transistor T3a may include a 3a-th gate electrode GE3a, a 3a-th active pattern ACT3a, a 3a-th source electrode SE3a, and a 3a-th drain electrode DE3a. The 3b-th transistor T3b may include a 3b-th gate electrode GE3b, a 3b-th active pattern ACT3b, a 3b-th source electrode SE3b, and a 3b-th drain electrode DE3b. Hereinafter, the 3a-th gate electrode GE3a and the 3b-th gate electrode GE3b may be referred to as a third gate electrode GE3, the 3a-th active pattern ACT3a and the 3b-th active pattern ACT3b may be referred to as a third active pattern ACT3, the 3a-th source electrode SE3a and the 3b-th source electrode SE3b may be referred to as a third source electrode SE3, and the 3a-th drain electrode DE3a and the 3b-th drain electrode DE3b may be referred as a third drain electrode DE3.

The third gate electrode GE3 may be coupled to the second scan line SL2. The third gate electrode GE3 may be provided as a portion of the second scan line SL2, or protrude from the second scan line SL2. According to an embodiment, each of the third active pattern ACT3, the third source electrode SE3 and the third drain electrode DE3 may be include a semiconductor layer that is doped, or not, with impurities. The third source electrode SE3 and the third drain electrode DE3 may include a semiconductor layer doped with impurities. The third active pattern ACT3 may include a semiconductor layer not doped with impurities. The third active pattern ACT3 may correspond to an overlapping portion with the third gate electrode GE3. One end of the third source electrode SE3 may be coupled to the third active pattern ACT3 and the other end thereof may be coupled to the first drain electrode DE1 of the first transistor T1 and the sixth source electrode SE6 of the sixth transistor T6. One end of the third drain electrode DE3 may be coupled to the third active pattern ACT3 and the other end thereof may be coupled to the fourth drain electrode DE4 of the fourth transistor T4. In addition, the third drain electrode DE3 may be coupled to the first gate electrode GE1 of the first transistor T1 through the connection line CNL, the second contact hole CH2 and the first contact hole CH1.

The fourth transistor T4 may have a dual gate structure in order to prevent leakage current. In other words, the fourth transistor T4 may include a 4a-th transistor and a 4b-th transistor. The 4a-th transistor may include a 4a-th gate electrode GE4a, a 4a-th active pattern ACT4a, a 4a-th source electrode SE4a, and a 4a-th drain electrode DE4a. The 4b-th transistor may include a 4b-th gate electrode GE4b, a 4b-th active pattern ACT4b, a 4b-th source electrode SE4b, and a 4b-th drain electrode DE4b.

Hereinafter, the 4a-th gate electrode GE4a and 4b-th gate electrode GE4b may be referred to as a fourth gate electrode GE4, the 4a-th active pattern ACT4a and the 4b-th active pattern ACT4b may be referred to as a fourth active pattern ACT4, the 4a-th source electrode SE4a and the 4b-th source electrode SE4b may be referred to as a fourth source electrode SE4, and the 4a-th drain electrode DE4a and the 4b-th drain electrode DE4b may be referred to as a fourth drain electrode DE4.

The fourth gate electrode GE4 may be coupled to the first scan line SL1. The fourth gate electrode GE4 may be provided as a portion of the first scan line SL1, or protrude from the first scan line SL1. Each of the fourth active pattern ACT4, the fourth source electrode SE4 and the fourth drain electrode DE4 may include a semiconductor layer that is doped, or not, with impurities. The fourth source electrode SE4 and the fourth drain electrode DE4 may include a semiconductor layer doped with impurities. The fourth active pattern ACT4 may include a semiconductor layer not doped with impurities. The fourth active pattern ACT4 may correspond to an overlapping portion with the fourth gate electrode GE4. One end of the fourth source electrode SE4 may be coupled to the fourth active pattern ACT4 and the other end thereof may be coupled to the initialization power supply line IPL and a seventh drain electrode DE7 of the seventh transistor T7 of a pixel in the previous row. An auxiliary connection line AUX may be provided between the fourth source electrode SE4 and the initialization power supply line IPL. One end of the auxiliary connection line AUX may be coupled to the fourth source electrode SE4 through a ninth contact hole CH9, and the other end thereof may be coupled to the initialization power supply line IPL in the previous row through an eighth contact hole CH8 in the previous row. One end of the fourth drain electrode DE4 may be coupled to the fourth active pattern ACT4 and the other end thereof may be coupled to the third drain electrode DE3 of the third transistor T3. In addition, the fourth drain electrode DE4 may be coupled to the first gate electrode GE1 of the first transistor T1 through the connection line CNL, the second contact hole CH2 and the first contact hole CH1.

The fifth transistor T5 may include a fifth gate electrode GE5, a fifth active pattern ACT5, a fifth source electrode SE5 and a fifth drain electrode DE5.

The fifth gate electrode GE5 may be coupled to the light emission control line EL. The fifth gate electrode GE5 may be provided as a portion of the light emission control line EL, or protrude from the light emission control line EL. Each of the fifth active pattern ACT5, the fifth source electrode SE5 and the fifth drain electrode DE5 may include a semiconductor layer that is doped, or not, with impurities. The fifth source electrode SE5 and the fifth drain electrode DE5 may include a semiconductor layer doped with impurities. The fifth active pattern ACT5 may include a semiconductor layer not doped with impurities. The fifth active pattern ACT5 may correspond to an overlapping portion with the fifth gate electrode GE5. One end of the fifth source electrode SE5 may be coupled to the fifth active pattern ACT5 and the other end thereof may be coupled to the power supply line PL through the fifth contact hole CH5. One end of the fifth drain electrode DE5 may be coupled to the fifth active pattern ACT5 and the other end thereof may be coupled to the first source electrode SE1 of the first transistor T1 and the second drain electrode DE2 of the and second transistor T2.

The sixth transistor T6 may include a sixth gate electrode GE6, a sixth active pattern ACT6, a sixth source electrode SE6 and a sixth drain electrode DE6.

The sixth gate electrode GE6 may be coupled to the light emission control line EL. The sixth gate electrode GE6 may be provided as a portion of the light emission control line EL, or protrude from the light emission control line EL. Each of the sixth active pattern ACT6, the sixth source electrode SE6 and the sixth drain electrode DE6 may include a semiconductor layer that is doped, or not, with impurities. The sixth source electrode SE6 and the sixth drain electrode DE6 may include a semiconductor layer doped with impurities. The sixth active pattern ACT6 may include a semiconductor layer not doped with impurities. The sixth active pattern ACT6 may correspond to an overlapping portion with the sixth gate electrode GE6. One end of the sixth source electrode SE6 may be coupled to the sixth active pattern ACT6 and the other end thereof may be coupled to the first drain electrode DE1 of the first transistor T1 and the third source electrode SE3 of the third transistor T3. One end of the sixth drain electrode DE6 may be coupled to the sixth active pattern ACT6 and the other end thereof may be coupled to a seventh source electrode SE7 of the seventh transistor T7.

The seventh transistor T7 may include a seventh gate electrode GE7, a seventh active pattern ACT7, a seventh source electrode SE7, and a seventh drain electrode DE7.

The seventh gate electrode GE7 may be coupled to the third scan line SL3. The seventh gate electrode GE7 may be provided as a portion of the third scan line SL3, or protrude from the third scan line SL3. Each of the seventh active pattern ACT7, the seventh source electrode SE7 and the seventh drain electrode DE7 may include a semiconductor layer that is doped, or not, with impurities. The seventh source electrode SE7 and the seventh drain electrode DE7 may include a semiconductor layer doped with impurities, and the seventh active pattern ACT7 may include a semiconductor layer not doped with impurities. The seventh active pattern ACT7 may correspond to an overlapping portion with the seventh gate electrode GE7. One end of the seventh source electrode SE7 may be coupled to the seventh active pattern ACT7 and the other end thereof may be coupled to the sixth drain electrode DE6 of the sixth transistor T6. One end of the seventh drain electrode DE7 may be coupled to the seventh active pattern ACT7 and the other end thereof may be coupled to the initialization power supply line IPL. In addition, the seventh drain electrode DE7 may be coupled to the fourth source electrode SE4 of the fourth transistor T4. The seventh drain electrode DE7 and the initialization power supply line IPL may be coupled to each other through the auxiliary line, the eighth contact hole CH8, and the ninth contact hole CH9.

The storage capacitor Cst may include the lower electrode LE and the upper electrode UE. The lower electrode LE may include the first gate electrode GE1 of the first transistor T1.

The upper electrode UE may overlap with the first gate electrode GE1 and cover the lower electrode LE as viewed in the plane. By enlarging the overlapping area between the upper electrode UE and the lower electrode LE, capacitance of the storage capacitor Cst may be increased. The upper electrode UE may extend in the first direction DR1. According to an embodiment, a voltage having the same level as the first power supply may be applied to the upper electrode UE. The upper electrode UE may have an opening OPN in a region where the first contact hole CH1 contacting the first gate electrode GE1 and the connection line CNL is formed.

The light emitting device OLED may include the anode AD, the cathode CD, and the emitting layer EML provided between the anode AD and the cathode CD.

The anode AD may be provided in a pixel area corresponding to each pixel. The anode AD may be coupled to the seventh source electrode SE7 of the seventh transistor T7 and the sixth drain electrode DE6 of the sixth transistor T6 through a seventh contact hole CH7 and a tenth contact hole CH10. A bridge pattern BRP may be provided between the seventh contact hole CH7 and the tenth contact hole CH10 and connect the sixth drain electrode DE6 and the seventh source electrode SE7 to the anode AD.

The auxiliary line AXL may be provided between the first transistor T1 (especially between the connection line CNL of the first transistor T1 and one of the first and second data lines DL1 and DL2).

Figure 13:
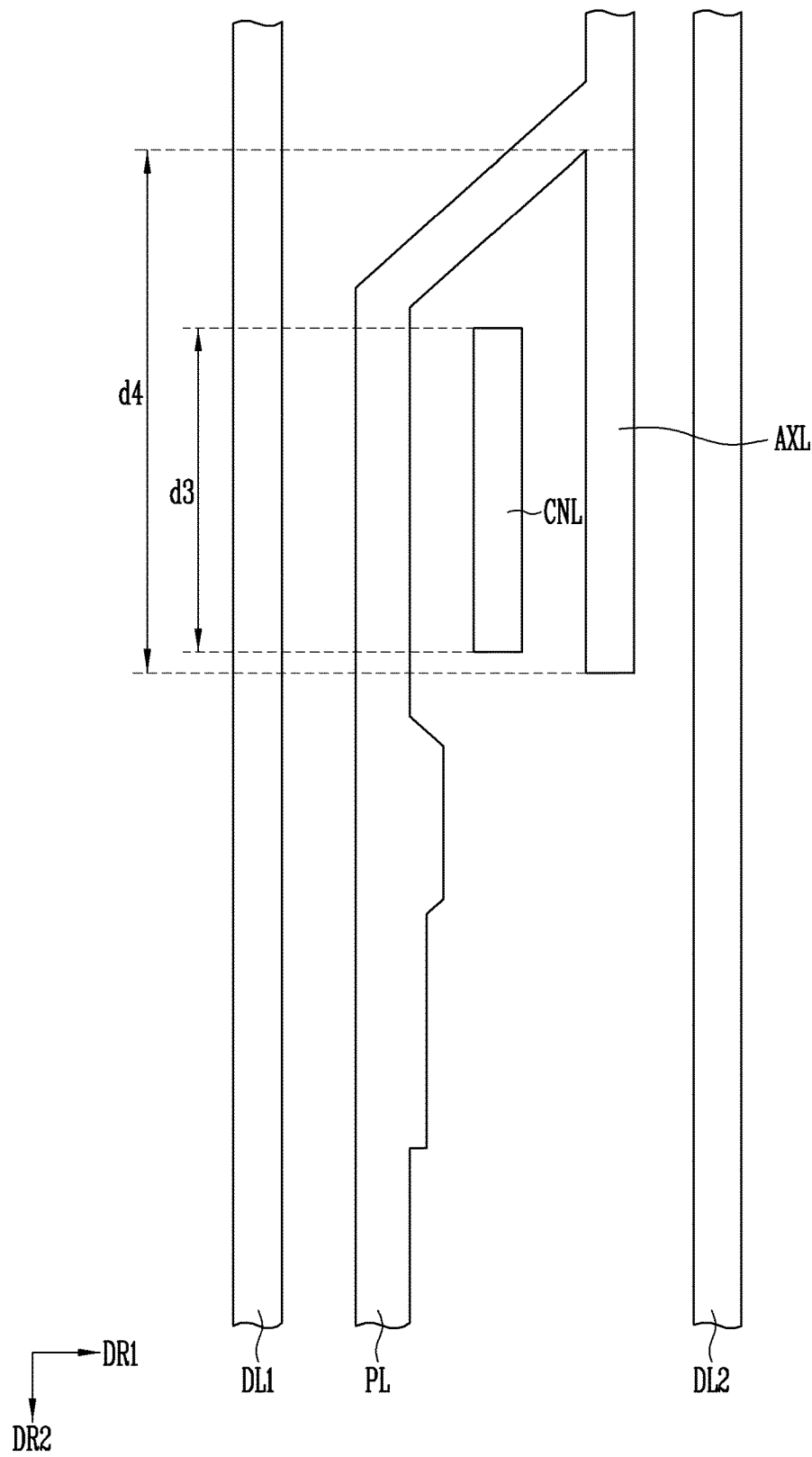
FIG. 13 is a plan view illustrating only first and second data lines, a power line and an auxiliary line shown in FIG. 12A.

FIG. 13 is a plan view illustrating the first and second data lines DL1 and DL2, the power supply line PL, and the auxiliary line AXL shown in FIG. 12A for convenience of explanation.

Referring to FIGS. 12A to 12C and 13, the auxiliary line AXL may be formed to prevent parasitic capacitance that may occur between the first transistor T1, which is a driving transistor, and one of the first and second data lines DL1 and DL2, especially parasitic capacitance that may occur between the connection line CNL of the first transistor T1 and one of the first and second data lines DL1 and DL2.

A fixed voltage (e.g., a predetermined fixed voltage) may be applied to the auxiliary line AXL.

In association with the first transistor T1, a considerable portion of the first gate electrode GE1 may be shielded by the upper electrode UE of the storage capacitor Cst. Thus, parasitic capacitance between the first gate electrode GE1 and one of the adjacent data lines DL may not be relatively large. However, the connection line CNL directly connected to the first gate electrode GE1 through the first contact hole CH1 may be formed on the same layer as the first and second data lines DL1 and DL2, and the same gate voltage as that of the first gate electrode GE1 may be applied thereto. Therefore, relatively large parasitic capacitance may be formed between the connection line CNL and the first and second data lines DL1 and DL2. In addition, the opening OPN through which the upper electrode UE of the storage capacitor Cst is partially removed may be formed in the region where the first contact hole CH1 for connecting the first gate electrode GE1 to the connection line CNL may be formed. The opening OPN may allow a portion of the first gate electrode GE1 that is not covered to have parasitic capacitance with the neighboring second data line DL2.

The auxiliary line AXL may be provided at a portion where a wiring line to which the fixed voltage is applied is not arranged, between the adjacent first and second data lines DL1 and DL2 on the basis of the connection line CNL. The wiring line to which the fixed voltage is applied may refer to a wiring line to which the fixed voltage having a predetermined potential is applied so as to prevent coupling between the connection line CNL and the adjacent data line DL. The fixed voltage line may be formed on the same layer as the connection line CNL and the first and second data lines DL1 and DL2 in order to reduce coupling between the connection line CNL and the neighboring data line DL.

According to the embodiment, the power supply line PL to which the first power supply is applied may correspond to the fixed voltage. In addition to the power supply line PL, another wiring line to which another fixed voltage is applied exists between the first gate electrode GE1 and the neighboring data line DL, the auxiliary line AXL may be provided at a portion where the corresponding line is not arranged. Hereinafter, a description is made to an example in which the wiring line to which the fixed voltage is applied is a power supply line.

The power supply line may be provided between the first gate electrode GE1 and one of the first and second data lines DL1 and DL2. The auxiliary line AXL may be provided between the first gate electrode GE1 and the other data line. According to an embodiment, as shown in FIG. 13, the power supply line PL may be provided between the connection line CNL and the first data line DL1. The auxiliary line AXL may be provided between the connection line CNL and the second data line DL2. When the power supply line PL is provided between the connection line CNL and the second data line DL2, the auxiliary line AXL may be provided between the connection line CNL and the first data line DL1.

According to an embodiment, the fixed voltage may be provided at substantially the same level as that of the driving voltage applied to the power supply line PL. The auxiliary line AXL may be coupled to the power supply line PL.

Referring again to FIG. 13, according to an embodiment, the auxiliary line AXL may be provided between the connection line CNL and the second data line DL2.

According to an embodiment, the auxiliary line AXL may extend in substantially the same direction as that of the second data line DL2, (e.g., in the second direction DR2).

The auxiliary line AXL may correspond to a length or width of the connection line CNL and be arranged between the second data line DL2 and the connection line CNL so as to prevent coupling between the second data line DL2 and the connection line CNL. Therefore, when the second data line DL2 is bent or inclined in a predetermined direction, or the second gate electrode GE2 is arranged in a different direction or formed into a different shape, the direction in which the auxiliary line AXL extends may also be determined accordingly. In other words, the direction in which the auxiliary line AXL extends may not be limited. The auxiliary line AXL may extend in a different direction from that shown in FIG. 13 if the auxiliary line AXL may prevent parasitic capacitance between the connection line CNL and the second data line DL2.

According to an embodiment, the auxiliary line AXL may be large enough to cover the connection line CNL. When the connection line CNL has a third length d3 in the second direction DR2, the auxiliary line AXL may have a fourth length d4 greater than or equal to the third length d3 in the second direction DR2. For example, when the second direction DR2 is a downward direction and an opposite direction to the second direction DR2 is an upward direction, a lower end portion of the auxiliary line AXL not connected to the power supply line PL may be located below a lower end portion of the connection line CNL.

According to an embodiment, the auxiliary line AXL may be arranged to cross imaginary lines connecting between the first data line DL1 and respective points of the first gate electrode GE1 facing the first data line DL1 by the shortest distances as viewed in the plane.

Because the auxiliary line AXL is formed between the connection line CNL and the second data line DL2, the distance between the second data line DL2 and the auxiliary line AXL may be smaller than the distance between the second data line DL2 and the connection line CNL.

According to an embodiment, as shown in FIG. 13, the auxiliary line AXL may be coupled to the power supply line PL and the entire auxiliary line AXL may extend in a direction parallel to the second direction DR2. However, the shape of the auxiliary line AXL may not be limited thereto. According to another embodiment, the body portion BDP in parallel with the second direction DR2 and the connection portion CNP arranged in another direction different from the second direction and connecting the power supply line PL to one end or the other end of the body portion BDP may be included. The connection portion CNP may be arranged to surround the connection line CNL in consideration of the bent shape and the extending direction of the power supply line PL. A portion where the connection portion CNP is provided may vary depending on the structure of the pixel, e.g., the shapes of the body portion BDP and the power supply line PL.

Therefore, the auxiliary line AXL may have a branch shape branching off from the power supply line PL and surround the connection line CNL, together with the power supply line PL. The auxiliary line AXL may be opened in a direction in which coupling between the connection line CNL and the first data line DL1 does not occur, i.e., in the second direction DR2 or the opposite direction to the second direction DR2. The auxiliary line AXL and the power supply line PL may include an open loop shape that is opened in the second direction DR2 or in the opposite direction to the second direction DR2.

Referring again to FIGS. 11, 12A and 12C, the structure of a display apparatus according to an embodiment will be described according to a stacking order.

The first to seventh active patterns ACT1 to ACT7 may be provided on the base substrate BS. The first to seventh active patterns ACT1 to ACT7 may include a semiconductor material.

A buffer layer may be provided between the base substrate BS and the first to seventh active patterns ACT1 to ACT7.

The gate insulating layer GI may be provided on the base substrate BS on which the first to seventh active patterns ACT1 to ACT7 are formed.

The first to third scan lines SL1 to SL3, the light emission control line EL, and the first to seventh gate electrodes GE1 to GE7 may be provided on the gate insulating layer GI. The first gate electrode GE1 may be the lower electrode LE of the storage capacitor Cst. The second gate electrode GE2 and the third gate electrode GE3 may be formed integrally with the second scan line SL2. The fourth gate electrode GE4 may be formed integrally with the first scan line SL1. The fifth gate electrode GE5 and the sixth gate electrode GE6 may be formed integrally with the light emission control line EL. The seventh gate electrode GE7 may be formed integrally with the third scan line SL3.

A first interlayer insulating layer IL1 may be provided over the base substrate BS on which the first scan line SL1 is formed.

The upper electrode UE of the storage capacitor Cst and the initialization power supply line IPL may be provided on the first interlayer insulating layer IL1. The upper electrode UE may cover the lower electrode LE and form the storage capacitor Cst with the lower electrode LE while interposing the first interlayer insulating layer IL1 interposed therebetween.

A second interlayer insulating layer IL2 may be provided over the base substrate BS on which the upper electrode UE is formed.

The first data line DL1, the second data line DL2, the power supply line PL, connection line CNL, the auxiliary connection line AUX, the bridge pattern BRP, and the auxiliary line AXL may be formed on the second interlayer insulating layer IL2.

The first data line DL1 may be connected to the second source electrode SE2 through the sixth contact hole CH6 passing through the first interlayer insulating layer IL1, the second interlayer insulating layer IL2, and the gate insulating layer GI. The second data line DL2 may be coupled to a pixel in the next row. The power supply line PL may be coupled to the upper electrode UE of the storage capacitor Cst through the third and fourth contact holes CH3 and CH4 passing through the second interlayer insulating layer IL2.

The power supply line PL may be connected to the fifth source electrode SE5 through the fifth contact hole CH5 passing through the first interlayer insulating layer IL1, the second interlayer insulating layer IL2, and the gate insulating layer GI.

The connection line CNL may be connected to the first gate electrode GE1 through the first contact hole CH1 passing through the first interlayer insulating layer IL1 and the second interlayer insulating layer IL2. In addition, the connection line CNL may be connected to the third drain electrode DE3 and the fourth drain electrode DE4 through the second contact hole CH2 passing through the gate insulating layer GI, the first interlayer insulating layer IL1 and the second interlayer insulating layer IL2.

The auxiliary connection line AUX may be coupled to the initialization power supply line IPL through the eighth contact hole CH8 passing through the second interlayer insulating layer IL2. The auxiliary connection line AUX may be coupled to the fourth source electrode SE4 and the seventh drain electrode DE7 in the previous row through the ninth contact hole CH9 passing through the gate insulating layer GI, the first interlayer insulating layer IL1, and the second interlayer insulating layer IL2.

The bridge pattern BRP may be provided between the sixth drain electrode DE6 and the anode AD as a medium connecting the sixth drain electrode DE6 and the anode AD. The bridge pattern BRP may be connected to the sixth drain electrode DE6 and the seventh source electrode SE7 through the seventh contact hole CH7 passing through the gate insulating layer GI, the first interlayer insulating layer IL1 and the second interlayer insulating layer IL2.

The auxiliary line AXL may be coupled to the power supply line PL and formed integrally with the power supply line PL.

The passivation layer PSV may be provided over the base substrate BS on which the first data line DL1 is formed.

The anode AD may be provided on the passivation layer PSV. The anode AD may be coupled to the bridge pattern BRP through the tenth contact hole CH10 passing through the passivation layer PSV. Because the bridge pattern BRP is coupled to the sixth drain electrode DE6 and the seventh source electrode SE7 through the seventh contact hole CH7, the anode AD may be finally coupled to the sixth drain electrode DE6 and the seventh source electrode SE7.

The pixel defining layer PDL may be provided over the base substrate BS on which the anode AD is formed so as to divide the pixel area PA to correspond to the respective pixels PXL. The pixel defining layer PDL may expose an upper surface of the anode AD and protrude from the base substrate BS around the pixel PXL.

The emitting layer EML may be provided in the pixel area PA surrounded by the pixel defining layer PDL and the cathode CD may be provided on the emitting layer EML.

The sealing layer SLM may be provided on the cathode CD to cover the cathode CD.

According to the above-described embodiment, parasitic capacitance between the first transistor T1, especially the connection line CNL of the first transistor T1 and the second data line DL2 may be minimized.

Figure 14:
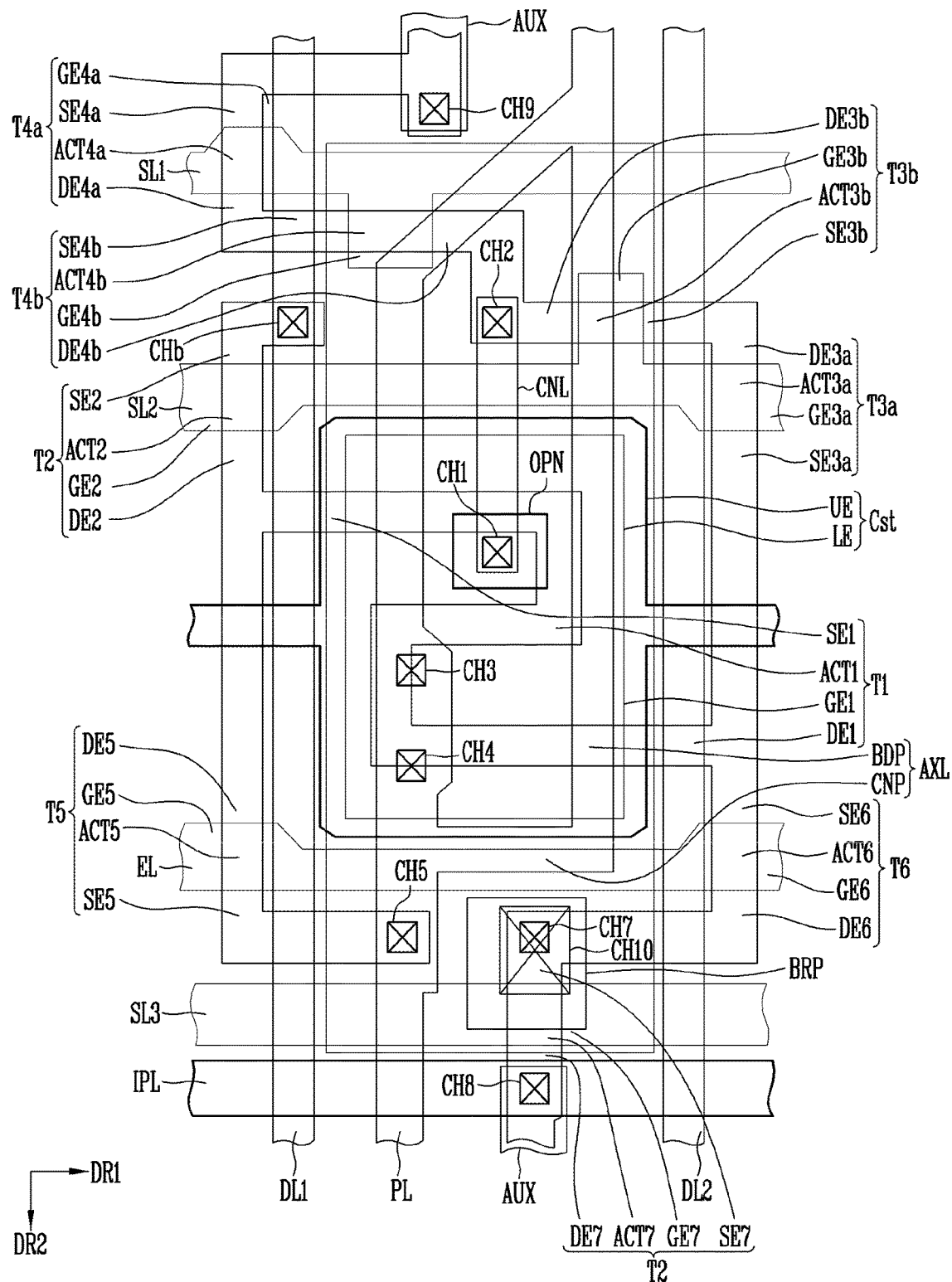
FIG. 14 is a plan view of another implementation of the display apparatus shown in FIG. 9.
Figure 15:
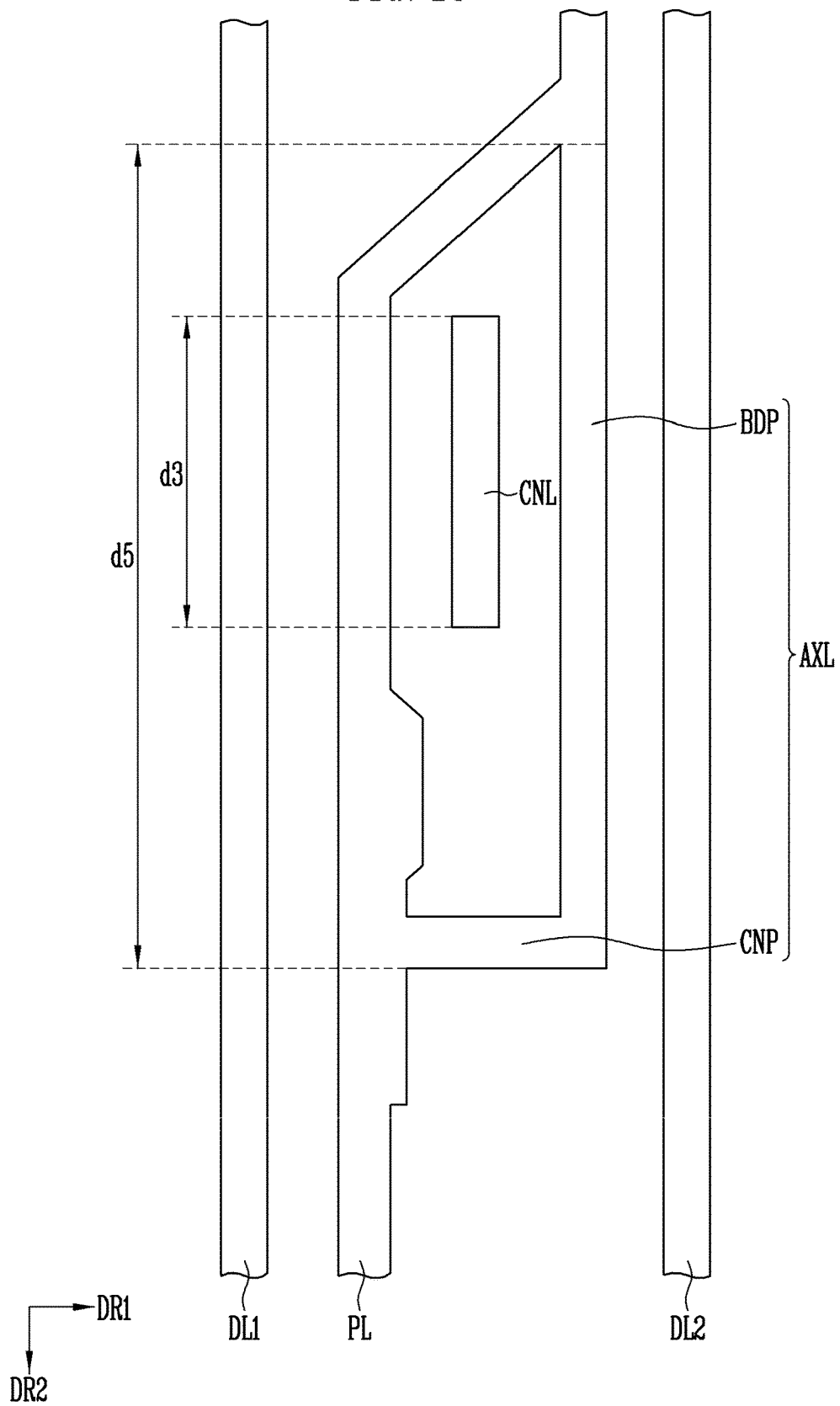
FIG. 15 is a plan view illustrating first and second data lines, a power line and an auxiliary line shown in FIG. 14.

According to another embodiment, the auxiliary line may have various shapes. FIG. 14 is a plan view of another implementation of a display apparatus shown in FIG. 9. FIG. 15 is a plan view only illustrating first and second data lines, a power supply line, and an auxiliary line shown in FIG. 14 for illustrative purpose.

Referring to FIGS. 14 and 15, a display apparatus according to another embodiment may include an auxiliary line having a closed loop shape.

According to this embodiment, the auxiliary line AXL may include the body portion BDP blocking formation of parasitic capacitance between the connection line CNL and the second data line DL2 and the connection portion CNP connecting the body portion BDP to the power supply line PL.

The body portion BDP may be provided between the connection line CNL and the second data line DL2. According to an embodiment, the body portion BDP may extend in substantially the same direction as the second data line DL2, i.e., the second direction DR2.

The body portion BDP may correspond to a length or width of the connection line CNL and be arranged between the connection line CNL and the second data line DL2 so as to prevent coupling between the connection line CNL and the first data line DL1. According to an embodiment, the body portion BDP may be large enough to cover the connection line CNL. For example, when the connection line CNL has the third length d3 along the second direction DR2, the auxiliary line AXL may have a fifth length d5 that is greater than or equal to the third length d3 in the second direction DR2.

The connection portion CNP may be provided between the power supply line PL and the body portion BDP and connect one end of the body portion BDP in a longitudinal direction to the power supply line PL. Both ends of each of the power supply line PL, the body portion BDP and the connection portion CNP may be sequentially connected to form a closed loop shape.

According to an embodiment, because the power supply line is connected to the auxiliary line, a fixed voltage (e.g., first power supply) applied to the power supply line may be applied thereto. Therefore, the auxiliary line may effectively shield an electric field so as not to cause coupling between the connection line and the second data line. For example, because the auxiliary line has the closed loop shape, the connection line may be effectively sealed in all directions.

According to the above-described embodiments, the description has been made to an example in which a power supply line is provided to each pixel as a fixed voltage line. In addition, the auxiliary line may be coupled to the power supply line. However, the power supply line is not necessarily used as the fixed voltage line. Another fixed voltage different from the first power supply may be applied if a different wiring line is connected to the auxiliary line to reduce or prevent parasitic capacitance. In such case, the auxiliary line may be coupled to the wiring line applying another fixed voltage.

Figure 16:
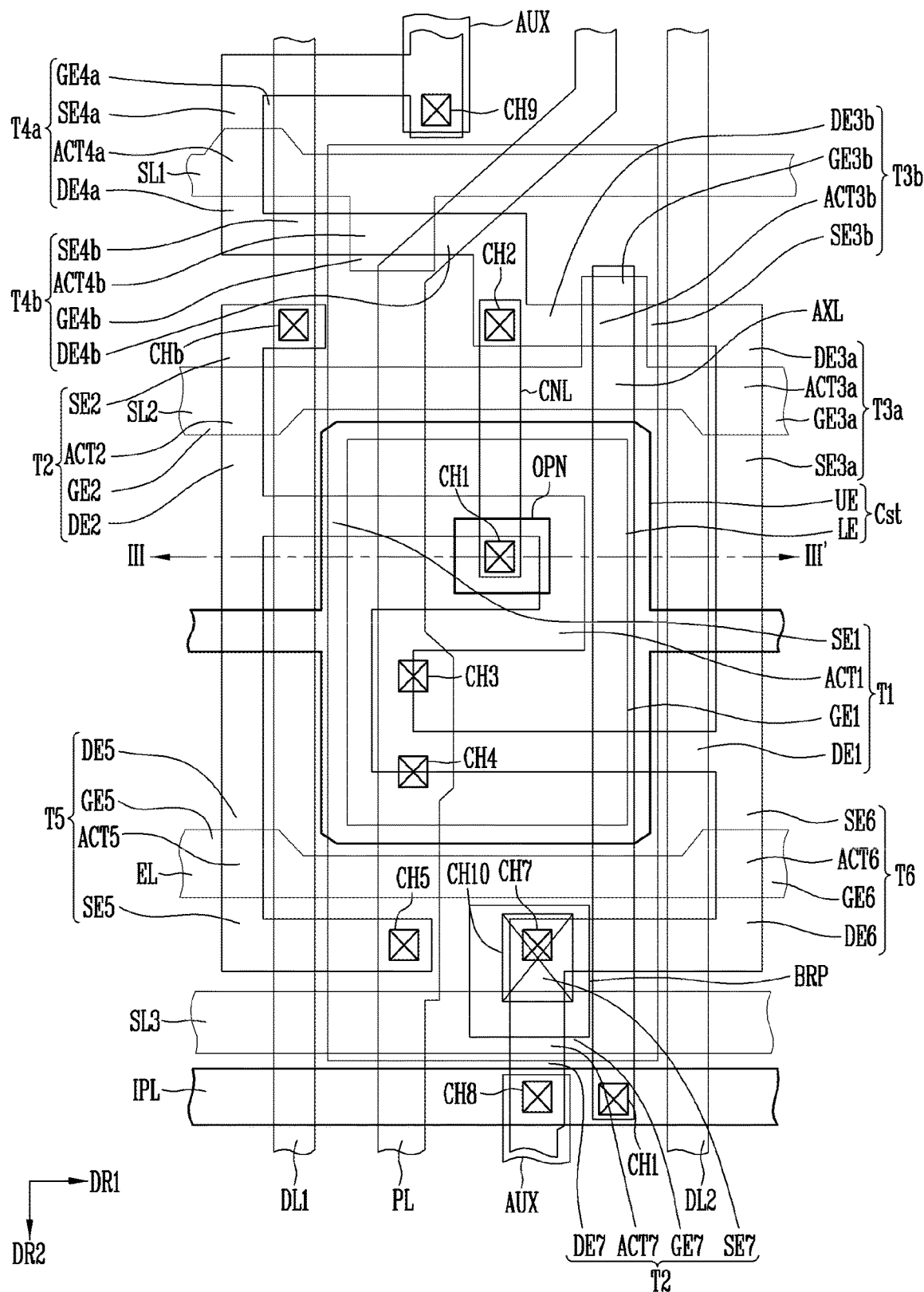
FIG. 16 is a plan view illustrating another implementation of the display apparatus shown in FIG. 9.

FIG. 16 is a plan view of another implementation of a display apparatus shown in FIG. 9. For the convenience of explanation, FIG. 17 is a plan view only illustrating first and second data lines, a power supply line, and an auxiliary line shown in FIG. 15.

Figure 17:
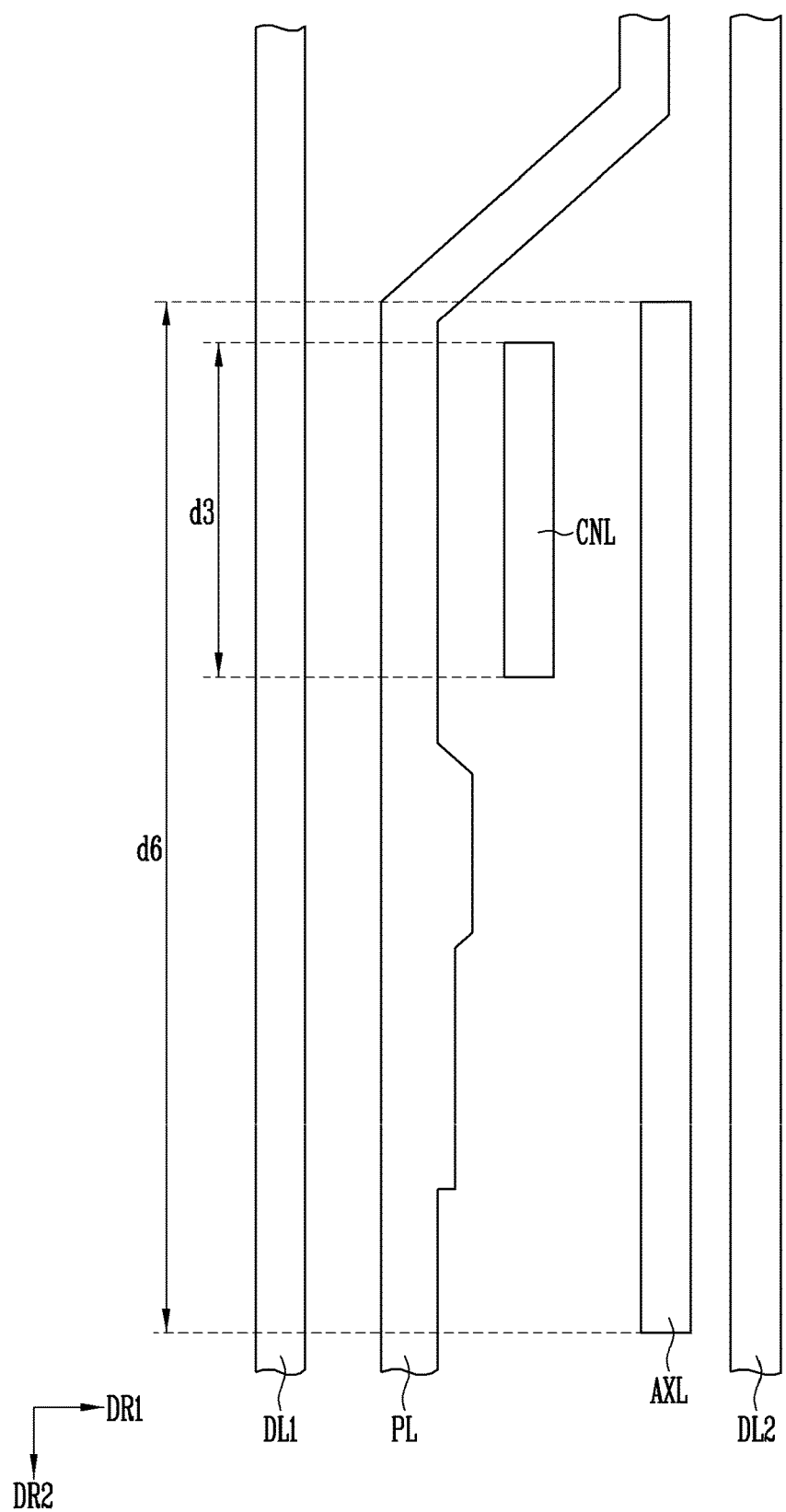
FIG. 17 is a plan view only illustrating first and second data lines, a power line and an auxiliary line shown in FIG. 15.

Referring to FIGS. 16 and 17, according to an embodiment, the auxiliary line AXL may be coupled to the initialization power supply line IPL to which an initialization power supply is applied. The initialization power supply which is a fixed voltage having a predetermined potential may be applied to the initialization power supply line IPL.

The initialization power supply line IPL may be provided on the first interlayer insulating layer IL1. The auxiliary line AXL may be provided on the second interlayer insulating layer IL2, and the auxiliary line AXL may be coupled to the initialization power supply line IPL through an eleventh contact hole CH11 passing through the second interlayer insulating layer IL2.

The auxiliary line AXL may extend in a longitudinal direction opposite to the second direction DR2 from a portion contacting the initialization power supply line IPL. The auxiliary line AXL may extend in the longitudinal direction across the connection line CNL and the second data line DL2 and be large enough to cover the connection line CNL. When the connection line CNL has the third length d3 in the second direction DR2, the auxiliary line AXL may have a sixth length d6 greater than or equal to the third length d3 in the second direction DR2. For example, when the second direction DR2 is a downward direction and a direction opposite to the second direction DR2 is an upward direction, a top end portion of the auxiliary line AXL not connected to the initialization power supply line IPL may be located above a top end portion of the connection line CNL.

The auxiliary line AXL may surround the connection line CNL, together with the power supply line PL, so that the auxiliary line AXL may be opened in the second direction DR2 and the opposite direction to the second direction DR2.

According to this embodiment, parasitic capacitance between the connection line and the first data line DL1 may be prevented or reduced by the power supply line to which a fixed voltage (i.e., first power supply) is applied. Parasitic capacitance between the connection line and the second data line DL2 may be prevented or reduced by the initialization power supply line to which the fixed voltage (i.e., initialization power supply) is applied.

The display apparatus having the above configuration and other embodiments may be used in various application products, for example, but not limited to, mobile devices, smart phones, electronic books, laptop computers, notebook computers, tablet computers, personal computers, and signboards.

According to an embodiment, parasitic capacitance between a driving transistor and a neighboring data line in each pixel may be prevented or reduced, so that a vertical crosstalk defect may be prevented or reduced. Accordingly, display quality of a display apparatus according to embodiments may be improved.

Although example embodiments are disclosed herein, these embodiments should not be construed to be limiting. Those of ordinary skill in the art would recognize that various changes in form and details may be made without departing from the spirit and scope of the present invention. Furthermore, those skilled in the various arts will recognize that the present invention described herein will suggest solutions to other tasks and adaptations for other applications. It is the applicant's intention to cover by the claims herein, all such uses of the present invention, and those changes and modifications which could be made to the example embodiments of the present invention herein chosen for the purpose of disclosure, all without departing from the spirit and scope of the present invention. Thus, the example embodiments of the present invention should be considered in all respects as illustrative and not restrictive, with the spirit and scope of the present invention being indicated by the appended claims, and their equivalents.

What is claimed is:

1. A display apparatus, comprising:
a scan line extending in a first direction;
a first data line and a second data line extending in a second direction crossing the first direction;
a fixed voltage line extending in the second direction between the first and second data lines and configured to receive a fixed voltage;
an auxiliary line between the fixed voltage line and one of the first and second data lines, wherein the fixed voltage is applied to the auxiliary line;
a transistor circuit comprising a second transistor coupled to the scan line and the first data line and a first transistor coupled to the second transistor and the fixed voltage line; and
a light emitting device coupled to the transistor circuit,
wherein at least a portion of the transistor circuit is between the fixed voltage line and the auxiliary line, and
wherein the auxiliary line is on a same layer as the fixed voltage line and the first and second data lines.

2. The display apparatus of claim 1, wherein the auxiliary line is configured to receive the fixed voltage having a same level as the fixed voltage line.

3. The display apparatus of claim 2, wherein the auxiliary line is coupled to the fixed voltage line.

4. The display apparatus of claim 1, wherein the auxiliary line has an open loop shape surrounding at least the portion of the transistor circuit, together with the fixed voltage line, and having an open end as viewed in a plane.

5. The display apparatus of claim 1, wherein the auxiliary line has a closed loop shape surrounding at least the portion of the transistor circuit, together with the fixed voltage line, as viewed in a plane.

6. The display apparatus of claim 1, wherein the fixed voltage line is a power supply line extending in the second direction.

7. The display apparatus of claim 6, wherein the auxiliary line is on a same layer as the power supply line and the first and second data lines.

8. The display apparatus of claim 7, wherein the auxiliary line comprises a body portion extending in the second direction.

9. The display apparatus of claim 8, wherein the body portion is between one of the first and second data lines and a gate electrode of the first transistor.

10. The display apparatus of claim 9, wherein the gate electrode has a first length in the second direction and the body portion has a length greater than or equal to the first length in the second direction.

11. The display apparatus of claim 8, wherein the auxiliary line extends from the power supply line.

12. The display apparatus of claim 11, wherein the auxiliary line comprises a first connection portion coupled to one end of the body portion and the power supply line.

13. The display apparatus of claim 12, wherein the auxiliary line comprises a second connection portion coupled to the other end of the body portion and the power supply line.

14. The display apparatus of claim 11, wherein the auxiliary line has a closed loop shape surrounding a gate electrode of the first transistor, together with the power supply line, as viewed in a plane.

15. The display apparatus of claim 11, wherein the auxiliary line has an open loop shape surrounding a gate electrode of the first transistor, together with the power supply line, and having an open one end as viewed in a plane.

16. The display apparatus of claim 8, wherein at least a portion of the first transistor is formed on a same layer as the first and second data lines.

17. The display apparatus of claim 16, wherein the first transistor comprises:
an active pattern on a base substrate;
a gate electrode on the active pattern with a gate insulating layer interposed therebetween;
a source electrode and a drain electrode coupled to the active pattern; and
a connection line coupled to the gate electrode.

18. The display apparatus of claim 17, wherein the connection line is formed on a same layer as the first and second data lines.

19. The display apparatus of claim 18, wherein an interlayer insulating layer is on the gate insulating layer, and
the connection line is on the interlayer insulating layer and connected to the gate electrode through a contact hole passing through the interlayer insulating layer.

20. The display apparatus of claim 19, further comprising an initialization power supply line extending in the first direction, wherein an initial fixed voltage is applied to the initialization power supply line.

21. The display apparatus of claim 20, wherein the auxiliary line is coupled to the initialization power supply line.

22. The display apparatus of claim 21, wherein the initialization power supply line is on the gate insulating layer, and the auxiliary line is coupled to the initialization power supply line through a contact hole passing through the interlayer insulating layer.

23. The display apparatus of claim 18, wherein the body portion is between one of the first and second data lines and the connection line as viewed in a plane.

24. The display apparatus of claim 23, wherein the body portion crosses an imaginary line connecting between the connection line and one of the first and second data lines by a shortest distance as viewed in the plane.

25. The display apparatus of claim 23, wherein the connection line has a second length in the second direction and the body portion has a length greater than or equal to the second length in the second direction.

26. The display apparatus of claim 23, wherein the auxiliary line extends from the power supply line.

27. The display apparatus of claim 26, wherein the auxiliary line further comprises a first connection portion connecting one end of the body portion and the power supply line to each other.

28. The display apparatus of claim 27, wherein the auxiliary line further comprises a second connection portion connecting the other end of the body portion and the power supply line.

29. The display apparatus of claim 23, wherein the auxiliary line has a closed loop shape surrounding the connection line, together with the power supply line, as viewed in the plane.

30. The display apparatus of claim 23, wherein the auxiliary line has an open loop shape surrounding the connection line, together with the power supply line, and having an open end as viewed in the plane.

31. The display apparatus of claim 17, wherein the connection line extends in the second direction.

32. The display apparatus of claim 1, wherein the auxiliary line crosses an imaginary line connecting between a gate electrode of the first transistor and one of the first and second data lines by a shortest distance as viewed in a plane.

33. The display apparatus of claim 1, wherein a distance between one of the first and second data lines and the auxiliary line is shorter than a distance between one of the first and second data lines and a gate electrode of the first transistor.

34. A display apparatus, comprising:
a scan line extending in a first direction;
a first data line and a second data line extending in a second direction crossing the first direction;
a power supply line extending in the second direction;
a second transistor coupled to the scan line and the first data line;
a first transistor between the first and second data lines and coupled to the second transistor and the power supply line; and
an auxiliary line between at least a portion of the first transistor and one of the first and second data lines,
wherein the power supply line is between at least the portion of the first transistor and the other data line, and a fixed voltage is applied to the auxiliary line, and
wherein the auxiliary line is on a same layer as the power supply line and the first and second data lines.

35. A display apparatus, comprising:
a wiring part and pixels coupled to the wiring part and arranged in a matrix of format,
wherein the wiring part comprises:
scan lines extending in a first direction;
a first data line and a second data line extending in a second direction crossing the first direction; and
power supply lines extending in the second direction,
wherein each of the pixels comprises:
a first transistor coupled to a corresponding scan line of the scan lines and one of the first and second data lines;
a second transistor between the first and second data lines and coupled to the first transistor and a corresponding power supply line of the power supply lines;
an auxiliary line between at least a portion of the first transistor and one of the first and second data lines; and
a display device coupled to the first transistor, and
wherein the power supply line is between at least the portion of the first transistor and the other data line, and a fixed voltage is applied to the auxiliary line, and
wherein the auxiliary line is on a same layer as the power supply line and the first and second data lines.

36. The display apparatus of claim 35, wherein the pixels comprise first pixels and second pixels arranged alternately in a column direction, the second transistor of each of the first pixels is coupled to the first data line, and the second transistor of each of the second pixels is coupled to the second data line.

* * * * *